(12) United States Patent
Miyata

(10) Patent No.: US 8,168,482 B2
(45) Date of Patent: May 1, 2012

(54) SEMICONDUCTOR DEVICE, AN ELECTRONIC DEVICE AND AN ELECTRONIC APPARATUS

(75) Inventor: Masayasu Miyata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/897,092

(22) Filed: Oct. 4, 2010

(65) Prior Publication Data

US 2011/0018074 A1 Jan. 27, 2011

Related U.S. Application Data

(63) Continuation of application No. 10/588,899, filed as application No. PCT/JP2005/002378 on Feb. 9, 2005, now abandoned.

(30) Foreign Application Priority Data

Feb. 10, 2004 (JP) .................................. 2004-33960
Oct. 20, 2004 (JP) ................................ 2004-306228

(51) Int. Cl.
*H01L 21/00* (2006.01)
*H01L 21/84* (2006.01)

(52) U.S. Cl. ......................... 438/149; 438/151; 257/411

(58) Field of Classification Search .................. 438/149, 438/151; 257/411
See application file for complete search history.

(56) References Cited

U.S. PATENT DOCUMENTS

| | | | |
|---|---|---|---|
| 4,621,277 A | 11/1986 | Ito et al. | |
| 5,521,127 A | 5/1996 | Hori | |
| 5,795,803 A * | 8/1998 | Takamura et al. | ............ 438/228 |
| 6,208,002 B1 | 3/2001 | Satake et al. | |
| 6,215,163 B1 | 4/2001 | Hori et al. | |
| 6,489,649 B2 | 12/2002 | Kobayashi et al. | |
| 6,596,585 B2 | 7/2003 | Kobayashi et al. | |
| 6,605,848 B2 | 8/2003 | Ngo et al. | |
| 6,764,902 B2 | 7/2004 | Kobayashi et al. | |
| 6,821,566 B2 | 11/2004 | Nakamura et al. | |
| 7,075,239 B2 | 7/2006 | Kang et al. | |
| 2002/0066934 A1 | 6/2002 | Kusunoki et al. | |

(Continued)

FOREIGN PATENT DOCUMENTS

EP 0 006 706 1/1980

(Continued)

OTHER PUBLICATIONS

International Search Report for PCT/JP2005/002378, dated Apr. 25, 2005; ISA/JP.
G. D. Wilk et al., Stable zirconium silicate gate dielectrics deposited directly on silicon, Applied Physics letters, U.S.A., American Institute of Physics, Jan. 3, 2000, vol. 76, No. 1, 112-114.
M. Quevedo-Lopez et al., Hafnium interdiffusion studies from hafnium silicate into silicon, Applied Physics Letters, U.S.A., American Institute of Physics, Dec. 17, 2001, vol. 79, No. 25, 4192-4194.

(Continued)

*Primary Examiner* — Phat X Cao

(57) ABSTRACT

A method for manufacturing a semiconductor device comprises preparing a base; forming a silicon oxide film including hydrogen or deuterium on the base; diffusing nitrogen into the silicon oxide film to form a gate insulating film; forming a gate electrode on the gate insulating film; ion doping the base to form source and drain regions along side a channel region; and forming a source electrode connected to the source region and a drain electrode connected to the drain region, the gate insulating film having a region where B/A is in the range of 1.6 to 10, where A is a concentration of nitrogen, and B is a concentration of hydrogen or deuterium, and the region is Y/10 of the thickness of the gate insulating film from the interface between the gate insulating film and the base, where Y is an average thickness of the gate insulating film.

12 Claims, 11 Drawing Sheets

U.S. PATENT DOCUMENTS

2002/0140043 A1    10/2002    Mitani et al.

FOREIGN PATENT DOCUMENTS

| JP | 54-163679 | 12/1979 |
| JP | 5-251428 | 9/1993 |
| JP | 6-204465 | 7/1994 |
| JP | 10-223628 | 8/1998 |
| JP | 10-242310 | 9/1998 |
| JP | 10-256539 | 9/1998 |
| JP | 2001-148381 | 5/2001 |
| JP | 2002-299399 | 10/2002 |
| JP | 2002-299612 | 10/2002 |

OTHER PUBLICATIONS

G. D. Wilk, et al., Electrical properties of hafnium silicate gate dielectrics deposited directly on silicon, Applied Physics Letters, U.S.A., American Institute of Physics, May 10, 1995, vol. 74, No. 19, 2854-2856.

Sin-ichi Saito et al., Inversion Electron Mobility Affected by Phase Separation in Hgih-permittivity Gate Dielectrics, Jpn. J. Appl. Phys., Japan, The Japan Society of Applied Physics, Dec. 1, 2003, Part 2, No. 12A, vol. 42 (2003), L1425-L1428.

* cited by examiner

SEMICONDUCTOR DEVICE, AN ELECTRONIC DEVICE AND AN ELECTRONIC APPARATUS

CROSS-REFERENCE TO RELATED APPLICATIONS

This application is a continuation of U.S. patent application Ser. No. 10/588,899 filed on Aug. 9, 2006; which is a National Stage of PCT/JP2005/002378 filed Feb. 9, 2005. This application claims the benefit of Japanese Patent Application No. 2004-033960 filed Feb. 10, 2004 and Japanese Patent Application No. 2004-306228 filed Oct. 20, 2004. The disclosures of the above applications are incorporated herein by reference.

TECHNICAL FIELD

The present invention relates to a semiconductor device, an electronic device and an electronic apparatus.

BACKGROUND ART

Recently, in devices including semiconductor integrated circuits, in order to improve high integration thereof, the size of each element tends to become miniaturization increasingly. In a Metal Oxide Semiconductor Field Effect Transistor (MOSFET), for example, the thickness of a gate insulating film (gate insulator) tends to become further thinner, and therefore it is difficult to ensure resistance to a dielectric breakdown of the insulating film.

The dielectric breakdown of a gate insulating film includes a Time Zero Dielectric Breakdown (TZDB) and a time-dependent dielectric breakdown (TDDB). The TZDB is an initial failure of the gate insulating film, and means a dielectric breakdown in which a large leakage current flows in the insulating film at the moment of applying an electric stress such as a voltage stress, a current stress or the like. On the other hand, the TDDB is a phenomenon in which a dielectric breakdown occurs in the gate insulating film when some time has passed since the application of an electric stress, not at the time point when the electric stress is applied to the gate insulating film.

Further, the TDDB is classified into a hard breakdown (HBD) and a soft breakdown (SBD). The HBD is a well-known dielectric breakdown, and a large leakage current flows in an insulating film after breakdown. On the other hand, the SBD is a state at which a leakage current flows more than at an initial insulating state, but less than at the time after the HBD occurs.

The HBD is a dielectric breakdown that occurs when a relatively high electric stress is applied to an insulating film. Once a leakage current flows when the HBD occurs, an insulating property thereof is never recovered even though the insulating film is left without application of an electric stress thereto thereafter. On the other hand, the SBD is a dielectric breakdown that often occurs when a low electric stress is applied thereto. There is a case in which an insulating property thereof is recovered if the insulating film is left without application of an electric stress thereto after a leakage current occurred. Therefore, a MOSFET in which a SBD occurs may function as a semiconductor device (semiconductor element) although an insulating property thereof becomes unstable. Further, there is a possibility that the SBD shifts the HBD as time goes by.

In addition, there is a low electric field leakage current referred to as a stress-induced leakage current (SILC) as deterioration after application of the electric stress. The SILC attracts attention as a precursor of the TDDB in addition to its effect on an insulating film to increase a leakage current. In this regard, each of the SILC and SBD still has many unclear points even though various examinations have been carried out. The SSD is also referred to as "B-mode SILC", and thus the distinction between the SILC and the SBD is unclear.

In these deterioration modes of the insulating film, the SBD and SILC particularly become problems in thinning a gate insulating film. In the case where the thickness of the gate insulating film (gate oxidized film) is 10 nm or less, the deterioration frequently occurs in the low electric field intensity range of 10 MV/cm or less (that is, in the low voltage range in which the electric field intensity is in the range of 10 MV/cm or less), and this becomes major cause that prevent a gate insulating film from being thinned.

For example, Japanese Laid-Open Patent Application No. 2002-299612 discloses an insulating film (gate insulating film) of a semiconductor device in which density of hydrogen atoms is reduced to a predetermined value in order to prevent the occurrence of the SILC. However, the above-mentioned patent application focuses on prevention of occurrence of the SILC, and as a result, the occurrence of the SBD is not examined and discussed in this application. In this regard, each of hydrogen atoms in the insulating film exists at a state of molecular hydrogen or at a connected state to any one of constituent elements of the insulating film. However, this patent application only defines the total amount of hydrogen atoms. According to consideration of the present inventor, it is understood that it is difficult to prevent the occurrence of SBD only by reducing the total amount of hydrogen atoms in the insulating film.

DISCLOSURE OF INVENTION

It is therefore an object of the present invention to provide a semiconductor device including an insulating film that can prevent SBD or SILC from occurring even in the case of thinning the insulating film and have high resistance to a dielectric breakdown such as SILC, TZDB, or TDDB (that is, that can improve insulating properties to SILC, TZDB, or TDDB). It is another object of the present invention to provide a highly reliable electronic device and electronic apparatus that include the above-mentioned semiconductor device.

In order to achieve the above object, in one aspect of the present invention, the present invention is directed to a semiconductor device. The semiconductor device includes:

a base which is mainly formed of a semiconductor material;

an object to be insulated from the base; and an insulating film provided between the base and the object for insulating the object from the base, the insulating film being formed of an insulative inorganic material as a main material, the insulative inorganic material containing silicon, oxygen and at least one kind of element other than silicon and oxygen, the insulating film being provided in contact with the base, and the insulating film containing hydrogen atoms, wherein the insulating film has a region where A and B satisfy the relation: B/A is 10 or less in the case where the total concentration of the at least one kind of element in the region is defined as A and the total concentration of hydrogen in the region is defined as B, in which the region is at least a part of the insulating film in the thickness direction thereof.

This makes it possible to prevent SBA or SILC from occurring even in the case of thinning the insulating film and to have high resistance to a dielectric breakdown such as SILC, TZDB, or TDDB (that is, it is possible to improve insulating properties to SILC, TZDB, or TDDB).

In the semiconductor device of the present invention, it is preferable that the region is unevenly located in the vicinity of an interface between the insulating film and the base.

This makes it possible to improve resistance to a dielectric breakdown of the insulating film while preventing change in the characteristics of the insulating film due to existence of the at least one kind of element (in an embodiment, element X).

In the semiconductor device of the present invention, it is preferable that, in the case where the average thickness of the insulating film is defined as Y, the region is located at a portion of the insulating film which resides within the thickness of Y/3 of the insulating film from the interface.

This makes it possible to improve resistance to a dielectric breakdown of the insulating film while preventing the change in the characteristics of the insulating film due to existence of the at least one kind of element (in an embodiment, element X).

In the semiconductor device of the present invention, it is preferable that the at least one kind of element includes at least one of nitrogen, carbon, aluminum, hafnium, zirconium, and germanium.

This makes it possible to reduce the amount of Si—OH structures in the insulating film more surely and to prevent the amount of Si—OH structures from increasing due to an external electric field more suitably while preventing the change in the characteristics of the insulating film. As a result, it is possible to prevent a dielectric breakdown of the insulating film (such as SBD, SILC) more surely.

In the semiconductor device of the present invention, it is preferable that the concentration of hydrogen and the concentration of the at least one kind of element are measured by means of Secondary Ion Mass Spectrometry.

In accordance with Secondary Ion Mass Spectrometry, it is possible to measure the concentration of hydrogen and the concentration of the at least one kind of element (in an embodiments element X) in an insulating film having a predetermined thickness with high accuracy.

In the semiconductor device of the present invention, it is preferable that each hydrogen atom in at least a part of the hydrogen atoms is replaced by a deuterium atom.

This makes it possible to improve resistance to a dielectric breakdown of the insulating film.

In the semiconductor device of the present invention, it is preferable that the average thickness of the insulating film is 10 nm or less.

According to the present invention, it is possible to remarkably improve resistance to a dielectric breakdown of the insulating film having a film thickness in the range described above.

In the semiconductor device of the present invention, it is preferable that the semiconductor device includes a gate electrode and a gate insulating film for insulating the gate electrode, and the gate insulating film is formed from the insulating film.

This makes it possible to prevent a dielectric breakdown of the gate insulating film, and therefore it is possible to improve the characteristics of the semiconductor device of the present invention.

In the semiconductor device of the present invention, it is preferable that the semiconductor device is adapted to be used under the condition that a gate voltage is applied to the gate electrode so that the electric field intensity in the insulating film is 10 MV/cm or less.

According to the present invention, it is possible to remarkably improve resistance to a dielectric breakdown of the insulating film in the semiconductor device to be used under such an applied voltage.

In the semiconductor device of the present invention, it is preferable that the maximum leakage current passing through the gate insulating film in the thickness direction thereof that is measured in a state that the gate voltage is applied to the gate electrode so that the electric field intensity in the insulating film is 3 MV/cm or less is $2\times10^{-8}$ A/cm$^2$ or less.

This makes it possible to further prevent a dielectric breakdown of the gate insulating film when the semiconductor device of the present invention is used.

In the semiconductor device of the present invention, it is preferable that the total amount of electrical charges passing through the gate insulating film in the thickness direction thereof until a soft breakdown occurs in the insulating film is 40 C/cm$^2$ or more.

This makes it possible to further prevent a dielectric breakdown of the gate insulating film when the semiconductor device of the present invention is used.

In the semiconductor device of the present invention, it is preferable that the total amount of electrical charges passing through the gate insulating film in the thickness direction thereof until a hard breakdown occurs in the insulating film is 100 C/cm$^2$ or more.

This makes it possible to further prevent a dielectric breakdown of the gate insulating film when the semiconductor device of the present invention is used.

Further, in another aspect of the present invention, the present invention is directed to an electronic device. The electronic device of the present invention includes the semiconductor device described above.

This makes it possible to obtain an electronic device having high reliability.

Moreover, in yet another aspect of the present invention, the present invention is directed to an electronic apparatus. The electronic apparatus of the present invention includes the electronic device described above.

This makes it possible to obtain an electronic apparatus having high reliability.

BRIEF DESCRIPTION OF DRAWINGS

The above and other objects, features, and the advantages of the invention will readily become more apparent from the following detailed description of preferred embodiments of the invention with reference to the accompanying drawings.

BEST MODE FOR CARRYING OUT THE INVENTION

Hereinafter, a semiconductor device, an electronic device and an electronic apparatus of the present invention will now be described with respect to preferred embodiments thereof. In this regard, a semiconductor device of the present invention has a feature in an insulating film that is applied to a gate insulating film of the semiconductor device.

<Semiconductor Device>

First, a semiconductor device of the present invention will now be described.

Figure 1:
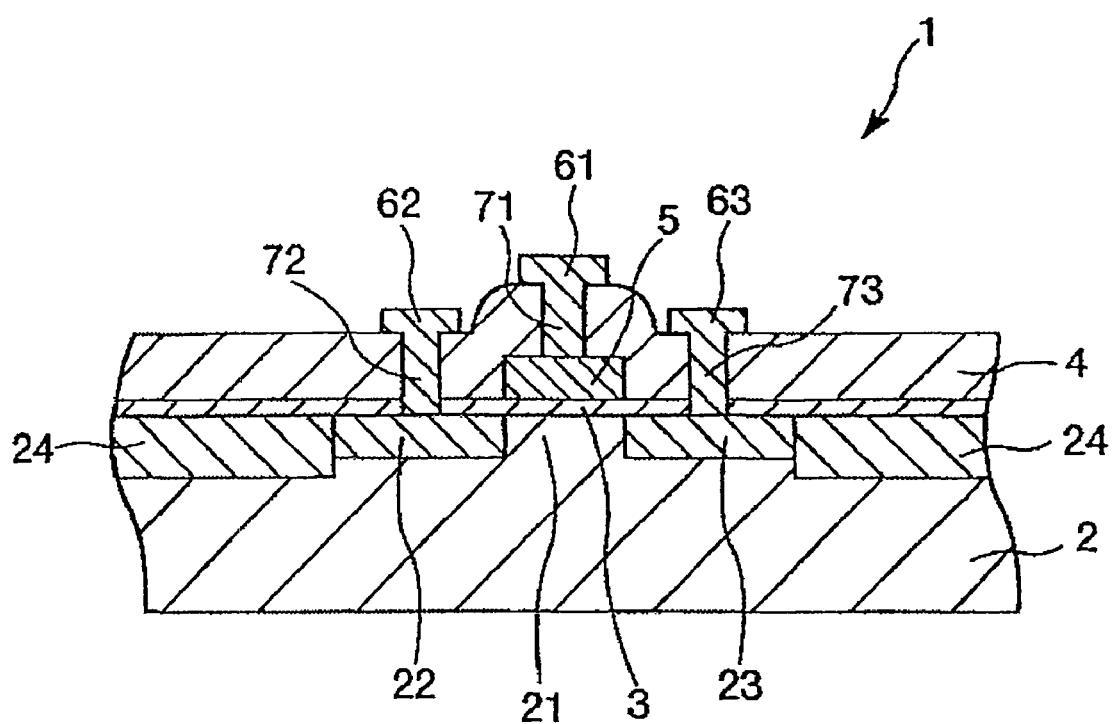
FIG. 1 is a longitudinal cross sectional view which shows a semiconductor device including an insulating film in one embodiment according to the present invention.
Figure 2:
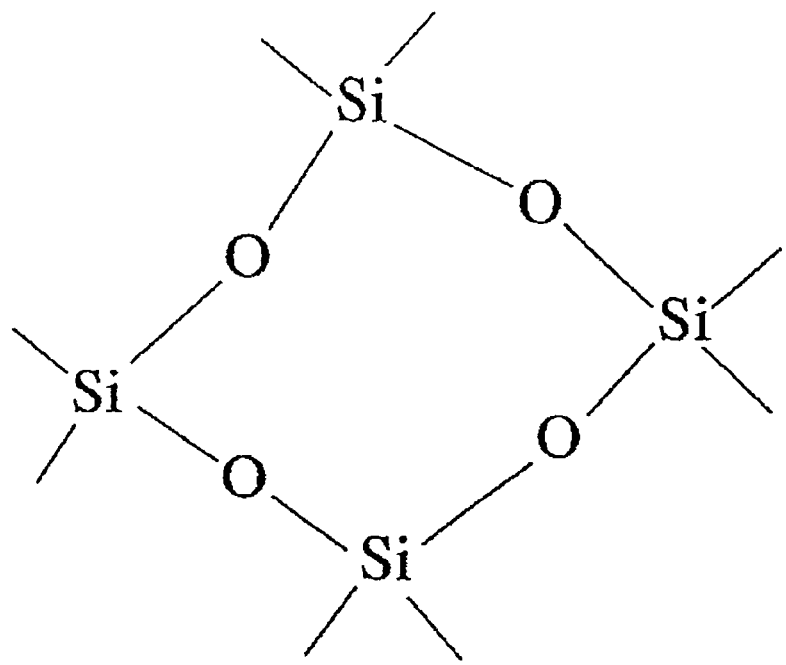
FIG. 2 is a schematic view which shows a molecular structure of the insulating film formed from SiO$_2$.
Figure 3:
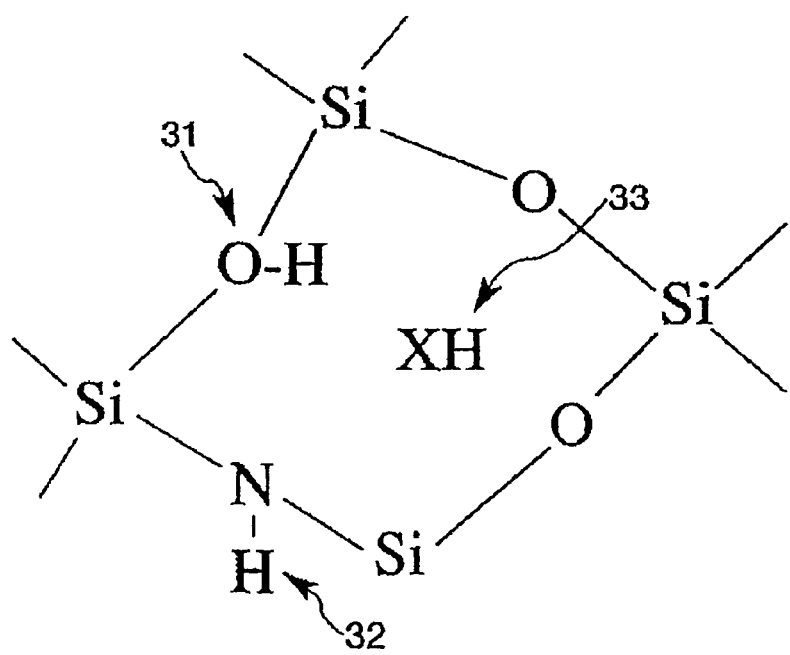
FIG. 3 is a schematic view which shows a molecular structure of the insulating film.

FIG. 1 is a longitudinal cross sectional view which shows a semiconductor device including an insulating film in one embodiment according to the present invention. FIG. 2 is a schematic view which shows a molecular structure of the insulating film formed from $SiO_2$. FIG. 3 is a schematic view which shows a molecular structure of the insulating film. Now, in following explanations using FIG. 1, for convenience of explanation, an upper side and lower side in FIG. 1 are referred to as "upper" and "lower", respectively.

A semiconductor device 1 shown in FIG. 1 includes a semiconductor substrate 2, a gate insulating film 3 provided so as to come into contact with the semiconductor substrate (base) 2, and an interlayer insulating film 4. The semiconductor substrate 2 includes an element separate structure 24, a channel region 21, a source region 22, and a drain region 23. The semiconductor device 1 further includes a gate electrode 5 provided so as to face the channel region 21 via the gate insulating film 3, a conductive portion 61 provided on the interlayer insulating film 4 and above the gate electrode 5, a conductive portion 62 provided on the interlayer insulating film 4 and above the source region 22 and functioning as a source electrode, a conductive portion 63 provided on the interlayer insulating film 4 and above the drain region 23 and functioning as a drain electrode, a contact plug 71 which electrically connects the gate electrode 5 to the conductive portion 61, a contact plug 72 which electrically connects the source region 22 to the conductive portion 62, and a contact plug 73 which electrically connects the drain region 23 to the conductive portion 63.

The semiconductor substrate 2 is formed of a semiconducting material including, for example, silicon such as polycrystalline silicon, amorphous silicon, or the like, germanium, gallium arsenide as a main material. As described above, the semiconductor substrate 2 has the element separate structure 24, and the channel region 21, the source region 22, and the drain region 23 are provided in regions compartmented by the element separate structure 24. Further, in the semiconductor substrate 2, the source region 22 is formed at one side portion of the channel region 21, while the drain region 23 is formed at the other side portion of the channel region 21.

The element separate structure 24 is constructed so that an insulating material such as $SiO_2$ is embedded in a trench. This makes it possible to separate adjacent elements electrically, and therefore it is possible to prevent interference between adjacent elements.

The channel region 21 is formed of an intrinsic semiconductor, for example. Each of the source region 22 and the drain region 23 are formed of a semiconductor material in which an intrinsic semiconductor is doped with an n-type impurity such as $P^+$ (phosphorus ion), for example.

It should be noted that each of the channel region 21, the source region 22 and the drain region 23 is not limited thereto. For example, each of the source region 22 and the drain region 23 may be constituted so as to be formed of a semiconducting material in which an intrinsic semiconductor is doped with a p-type impurity. Further, the channel region 21 may be constituted so as to be formed of a semiconducting material in which an intrinsic semiconductor is doped with a p-type or n-type impurity.

Such a semiconductor substrate 2 is covered with an insulating film (that is, the gate insulating film 3 and the interlayer insulating film 4)— The portion of the insulating film (the gate insulating film 3) that is sandwiched between the channel region 21 and the gate electrode 5 serves as a channel of an electric field, generated between the channel region 21 and the gate electrode 5.

The semiconductor device of this embodiment has a feature in the structure of this gate insulating film 3. This point (feature) will be described later in detail.

The constituent material of the interlayer insulating film 4 is not particularly limited, and for example, silicon system compound such as $SiO_2$, TEOS (ethyl silicate), poly-silazane can be used as the constituent material of the interlayer insulating film 4 In addition, the interlayer insulating film 4 can be formed of any one of various resin materials, various ceramics materials and the like, for example.

The conductive portions 61, 62 and 63 are provided on the interlayer insulating film 4. As described above, the conductive portion 61 is formed above the channel region 21, and the conductive portions 62, 63 are formed above the source region 22 and the drain region 23, respectively.

Further, in the gate insulating film 3 and the interlayer insulating film 4, a hole portion (contact hole) communicated to the gate electrode 5, a hole portion communicated to the source region 21, and a hole portion communicated to the drain region 23 are formed in the region where the channel region 21, the source region 22, and the drain region 23 are formed, respectively. The contact plugs 71, 72 and 73 are provided in these hole portions, respectively.

The conductive portion 61 is connected to the gate electrode 5 via the contact plug 71. The conductive portion 62 is connected to the source region 22 via the contact plug 72. The conductive portion 63 is connected to the drain region 23 via the contact plug 73.

Next, a structure of the gate insulating film 3 will now be described. In the present invention, the gate insulating film 3 is formed of an insulative inorganic material as a main material. The insulative inorganic material contains silicon, oxygen and at least one kind of element X other than silicon and oxygen.

Here, for example, as shown in FIG. 2, the insulating film formed of silicon oxide ($SiO_z$; $0 < z \leq 2$) as a main material, that is, the $SiO_2$ film not including the element X is constructed from substantially complete three-dimension network of Si—O bonding formed by coordinating one silicon atom with four oxygen atoms as well as by coordinating one oxygen atom with two silicon atoms. The $SiO_2$ film is in an amorphous state at which the directionality of bonding becomes disorganized. When the $SiO_2$ film is formed by means of a thermal oxidation method, a CVD (Chemical Vapor Deposition) method or the like as described later, hydrogen atoms inevitably come to be mixed in the inside of the $SiO_2$ film due to gases existing in the atmosphere which includes molecular hydrogen and hydrogen atom. Then, hydrogen atoms exist in the inside of the $SiO_2$ film as a Si—OH structure or a Si—H structure as well as molecular hydrogen ($H_2$). In this case, any of the hydrogen atoms respectively react with Si—O bonding structures to form the Si—OH structure and the Si—H structure (that is, to intrude into the $SiO_2$ film), and as a result, they have an impact on an electronic structure (electronic state) of the constituent material of the gate insulating film 3.

The inventor of the present invention persevered in examination and found that a Si—OH structure 31 in which one oxygen atom is coordinated with three other atoms (which are two Si atoms and one H atom in FIG. 3) by means of first principle electronic structure simulation, and that an excess electron contributes a current that flows in an insulating film. Namely, the inventor found that it is impossible to prevent a leakage current from flowing in the insulating film only by control the total amount of hydrogen atoms in the $SiO_2$ film, and that the less the total amount of Si—OH structures 31 is, the less a leakage current flows over the gate insulating film 3 (that is, the occurrence of the TZDB is prevented).

Further, the inventor found that the Si—OH structure 31 in which one oxygen atom is coordinated with three other atoms is susceptible to an external electric field and stabilized by taking in hydrogen atoms that reside in the inside of the SiO2 film due to the external electric field to be increased, and as a result a leakage current due to the electric stress (that is, SILC) may be increased, by which a generation mechanism of the SBD can be explained. Then, the inventor found that the HBD tends to occur as these results (that is, the TDDB occurs easily).

The inventor of the present invention further persevered in examination and assumed that it is possible to reduce an absolute quantity of the Si—OH structures 31 that reside in the gate insulating film 3 by taking at least one element X other than silicon and oxygen into an insulative inorganic material of the gate insulating film 3 and it is possible to prevent the amount of Si—OH structures 31 from increasing due to an external electric field. Namely, the inventor assumed that hydrogen atoms in the gate insulating film 3 are consumed to form the bonding between a hydrogen atom and an element X by constituting the gate insulating film 3 by the insulative inorganic material containing the at least one element X in addition to silicon and oxygen.

In the case where the element X is nitrogen, for example, a nitrogen atom reacts with a S—O structure and then the nitrogen atom that intrudes into the inside of the $SiO_2$ film bonds to a hydrogen atom, by which an N—H structure 32 is formed as shown in FIG. 3. On the other hand, in the case where the element X is any element other than nitrogen, a XH molecule 33 is formed inside the $SiO_2$ film, for example. As a result, it is possible to reduce the amount of Si—OH structures 31 that reside in the gate insulating film 3 relatively, and to prevent the Si—OH structures 31 from increasing due to an external electric field. The inventor of the present invention assumed that it is possible to improve resistance to a dielectric breakdown of the gate insulating film 3 in this manner.

By persevering in examination on the basis of such an assumption, the inventor of the present invention found that it is possible to improve resistance to a dielectric breakdown of the gate insulating film 3 when A and B satisfy the relation: B/A is 10 or less in the case where the total concentration of the element X in the gate insulating film 3 is defined as A and the total concentration of hydrogen in the gate insulating film 3 is defined as B. In the process of examination, the inventor begun to understand that the SILC and the SBD particularly arise in the vicinity of an interface between the semiconductor substrate (base) 2 and the gate insulating film 3 in the gate insulating film 3, and progress over the whole of the gate insulating film 3.

Therefore, it is preferable that a region having the relation of the element X and hydrogen described above is unevenly located in the vicinity of the interface between the gate insulating film 3 and the semiconductor substrate (base) 2. This makes it possible to prevent the occurrence of the SILC or the SBD surely. In this regard, the semiconductor device 1 may be constructed so as to satisfy the relation of the element X and hydrogen described above in the whole of the gate insulating film 3. However, it is possible to reduce the absolute quantity of element X in the gate insulating film 3 by unevenly locating such a region in the vicinity of the interface between the gate insulating film 3 and the semiconductor substrate (base) 2. This makes it possible to prevent the change in the characteristics of an insulating film (in this case, the characteristics of the gate insulating film) in response to the change in an element X content in the gate insulating film 3.

In this way, by unevenly locating the region where the relation of the element X and hydrogen in the vicinity of the interface between the gate insulating film 3 and the semiconductor substrate 2 is satisfied, that is, A and B satisfy the relation: B/A is 10 or less in the case where the total concentration of the element X in the region is defined as A and the total concentration of hydrogen in the region is defined as B, it is possible to prevent both the occurrence of a dielectric breakdown of the gate insulating film 3 (such as SBD, SILC) and the change in the characteristics of the gate insulating film 3 suitably. In view of such a point, it is preferable that the relation of the element X and hydrogen described above is satisfied in the region of the gate insulating film 3 as close to the semiconductor substrate 2. More specifically, in the case where the average thickness of the gate insulating film 3 is defined as Y, it is preferable that the region is located at a portion of the gate insulating film 3 which resides within the thickness of Y/3 of the gate insulating film 3 from the interface, and more preferably the portion resides within the thickness of Y/5 of the gate insulating film 3 from the interface. Further more preferably the portion resides within the thickness of Y/10 of the gate insulating film 3 from the interface. This makes it possible to achieve the effect described above more markedly.

Further, in the region as described above, A and B may satisfy the relation: B/A is 10 or less. However, it is preferable that B/A is 5 or less, and more preferably it is 2 or less. This makes it possible to prevent a dielectric breakdown (such as SBD, SILC) of the gate insulating film 3 ($SiO_2$ film) more surely.

In this regard, the concentration of hydrogen and the concentration of the element X that are contained in an arbitrary thickness of the gate insulating film 3 (SiOz film) can be measured by means of any one or more of Secondary Ion Mass Spectrometry, X-ray Photoelectron Spectroscopy, Hydrogen Forward scattering Spectrometry, Rutherford Backscattering Spectrometry, and Thermal Desorption Spectroscopy, for example. In particular, it is preferable that the concentration is measured by means of Secondary Ion Mass Spectrometry among them. According to Secondary Ion Mass Spectrometry, it is possible to measure the concentration of the element X and the concentration of hydrogen in the arbitrary thickness with high accuracy.

Further, the element X may be any one as long as the element X bonds to a hydrogen atom efficiently while preventing the change in the characteristics of a $SiO_2$ film as an insulator. The element X is not particularly limited, but it is preferable that the element X includes at least one of nitrogen, carbon, aluminum, hafnium, zirconium, and germanium. In the case where the insulative inorganic material contains such an element, it is possible to reduce the amount of Si—OH structures 31 that reside in the gate insulating film 3 more surely while preventing the change in the characteristics of the gate insulating film 3. In addition, it is possible to prevent (or inhibit) the Si—OH structures 31 from increasing due to an external electric field more suitably. This makes it possible to prevent a dielectric breakdown of the gate insulating film 3 (such as SBD, SILC) more surely.

In this regard, by containing nitrogen atoms as the element X, it is possible to improve compactness of the gate insulating film 3, for example. Further, by containing nitrogen, hafnium, zirconium, or aluminum as the element X, it is possible to improve the stability of the gate insulating film 3 and dielectric constant of the gate insulating film 3, for example.

A method of forming the gate insulating film 3 described above will be described later as well as a method of manufacturing the semiconductor device 1.

A semiconductor device 1 having such a $SiO_2$ film as the gate insulating film 3 can obtain stable characteristics and decay resistance.

Each hydrogen atom in at least a part of the hydrogen atoms in the gate insulating film 3 may be replaced by deuterium atom. This makes it possible to further reduce instable (or susceptible) structures, that is, the Si—OH structures 31 to an external electric field, and as a result, it is possible to improve resistance to a dielectric breakdown of the gate insulating film 3.

It is preferable that the average thickness of the gate insulating film 3 (the average film thickness) is 10 nm or less, and more preferably it is in the range of about 1 to 7 nm. Further, more preferably the average thickness of the gate insulating film 3 is in the range of about 1 to 2 nm. By restricting the thickness of the gate insulating film 3 within the above range, it is possible to make the semiconductor device 1 smaller sufficiently. Further, the SILC or SBD tends to occur frequently in particular when the thickness of the gate insulating film 3 is made thinner as the range described above. Thus, by applying the present invention to the gate insulating film 3 having such a thinner film thickness, it is possible to exert an effect of the present invention prominently.

Further, it is preferable that the semiconductor device 1 is adapted to be used under the condition that a gate voltage is applied to the gate electrode 5 so that the electric field intensity in the gate insulating film 3 is 10 MV/cm or less. More preferably the electric field intensity in the gate insulating film 3 is 5 MV/cm or less, and further more preferably it is 3 MV/cm or less. The SILC or SBD tends to occur in the range of the above-mentioned electric field intensity. However, in the case of the gate insulating film 3 that is used at such electric field intensity, by applying the present invention it is possible to achieve the effect to prevent the SILC or SBD from occurring noticeably.

In this regard, there is a fear that an irreversible dielectric breakdown (that is, HBD) occurs when higher electric field intensity over the upper limit described above is applied to the inside of the gate insulating film 3 (that is, the higher gate voltage as described above is applied to the gate electrode 5).

Moreover, it is preferable that the maximum leakage current passing through the gate insulating film 3 in the thickness direction thereof that is measured in a state that the gate voltage is applied to the gate electrode 5 so that the electric field intensity in the insulating film is 3 MV/cm or less is $2\times10^{-8}$ $A/cm^2$ or less. More preferably the maximum leakage current is $1\times10^{-8}$ $A/cm^2$ or less, and further more preferably it is $9\times10^{-8}$ $A/cm^2$ or less. By satisfying such a condition in the gate insulating film 3, it is difficult for a dielectric breakdown of the gate insulating film 3 to occur when the semiconductor device 1 is used.

In this regard, the reasons why the relation between the electric field intensity in the gate insulating film 3 and the maximum leakage current measured at the electric field intensity is set as described above are as follows.

First, in the case where the average thickness of the gate insulating film 3 is in the range as described above, that is, the thickness of the gate insulating film 3 is relatively thin, the semiconductor device 1 is normally used so that the electric field intensity (absolute value) in the gate insulating film 3 is set to a predetermined value that is 3 MV/cm or less with high frequency.

Figure 11:
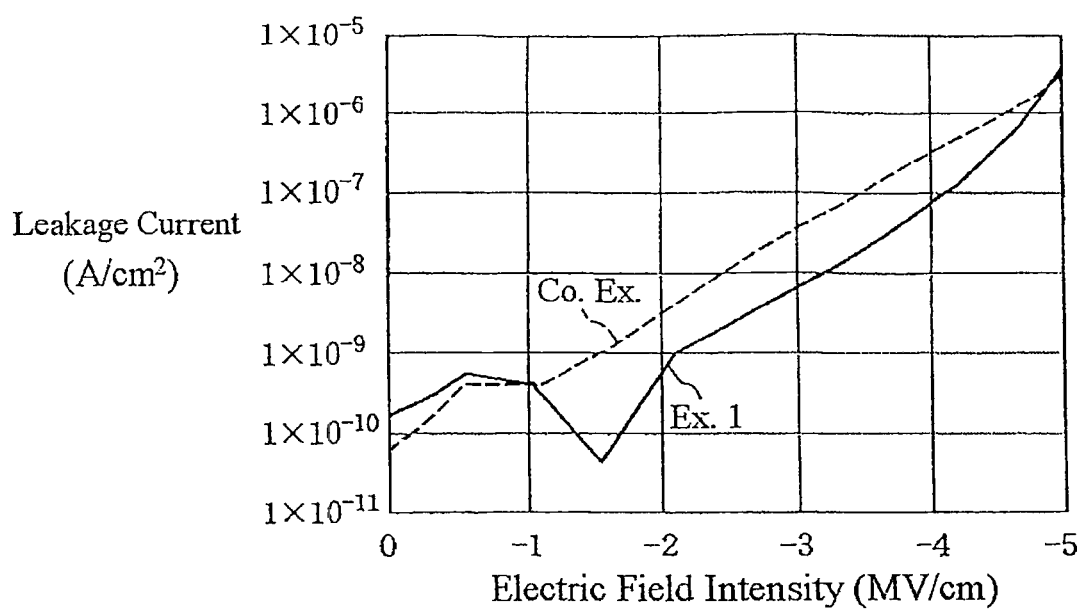
FIG. 11 is a graph which shows a relationship between a change in electric field intensity and a change in a leakage current both measured in the insulating films of Example 1 and Comparative Example 1.

Second, the leakage current value at predetermined electric field intensity tends to become large as the predetermined electric field intensity in an insulating film becomes larger. As shown in FIG. 11, in the insulating film of the semiconductor device according to the present invention in which A and B satisfy the relation described above, the logarithmic value of a leakage current that flows in the insulating film at an electric field intensity (absolute value) which is in the range of 2.2 to 4.0 MV/cm tends to change substantially linearly. For this reason, in the case where reference electric field intensity is set within the range, the leakage current value at such reference electric field intensity is in stable, and therefore such an insulating film has superior reproducibility.

Comprehensively judging by the first and second reasons described above, it is thought that to utilize the electric field intensity of 3 MV/cm (absolute value) that is a substantially middle point of the above range as the reference electric field intensity is appropriate. Thus, the electric field intensity of 3 MV/cm (absolute value) is superior to use as the reference electric field intensity in view of practicability and reproducibility. In the present invention, by controlling the maximum value of the leakage current measured at the electric field intensity of 3 MV/cm (absolute value) or less to the above-mentioned value or less, it is possible to prevent a dielectric breakdown of the gate insulating film 3 from occurring suitably. As a result, it is hard for a dielectric breakdown of the gate insulating film 3 to occur when using the semiconductor device 1 of the present invention.

Therefore, the semiconductor device 1 of the present invention having such a gate insulating film 3 described above behaves high reliability when the semiconductor device 1 is actually used as a product.

Further, in the case where the time point at which a small voltage change is initially generated is the SBD (soft breakdown) by supplying a constant current to the gate insulating film 3, it is preferable that the total amount of electric charges passing through the gate insulating film 3 in the thickness direction thereof until a soft breakdown (SBD) occurs in the gate insulating film 3 is 40 $C/cm^2$ or more. More preferably the total amount of the electric charges is 75 $C/cm^2$ or more. By satisfying such a condition in the gate insulating film 3, it is difficult for a dielectric breakdown of the gate insulating film 3 to occur when the semiconductor device 1 is used.

Further, in the case where the time point at which a drastic voltage change is generated is the HBD (hard breakdown), it is preferable that the total amount of electric charges passing through the gate insulating film 3 in the thickness direction thereof until a hard breakdown (HBD) occurs in gate the insulating film 3 is 100 C/cm$^2$ or more. More preferably the total amount of electric charges is 200 C/cm$^2$ or more. By satisfying such a condition in the gate insulating film 3, it is difficult for a dielectric breakdown of the gate insulating film 3 to occur when the semiconductor device 1 is used.

The structure of the semiconductor device 1 of the present invention including the gate insulating film 3 has been described on the basis of preferred embodiment shown in FIGS. 1-3, but such an insulating film having a feature described above can be applied to the interlayer insulating film 4 in the semiconductor device 1 of the present invention.

<Method of Manufacturing Semiconductor Device>

Next, a method of manufacturing the semiconductor device shown in FIG. 1 will now be described. FIG. 4A-4H are longitudinal cross sectional views for explaining a method of manufacturing the semiconductor device shown in FIG. 1. Now, in following explanations using FIGS. 4A-4H, for convenience of explanation, an upper side and lower side in FIGS. 4A-4H are referred to as "upper" and "lower", respectively.

Figure 4A:
FIGS. 4A-4H are longitudinal cross sectional views for explaining a method of manufacturing the semiconductor device shown in FIG. 1.

<1> As shown in FIG. 4A, a trench element separate structure 24 is formed on the surface of a semiconductor substrate 2 by means of Local Oxidation of Silicon (LOCOS) method or the like. Thus, element forming regions are compartmented on the surface of the semiconductor substrate 2.

<2> Next, a well is formed by carrying out ion doping onto the semiconductor substrate 2. For example, in the case of forming a p-well, p-type impurities such as B$^+$ ions or the like are doped into the semiconductor substrate 2, while in the case of forming an n-well, n-type impurities such as P$^+$ ions or the like are doped into the semiconductor substrate 2.

Figure 4B:
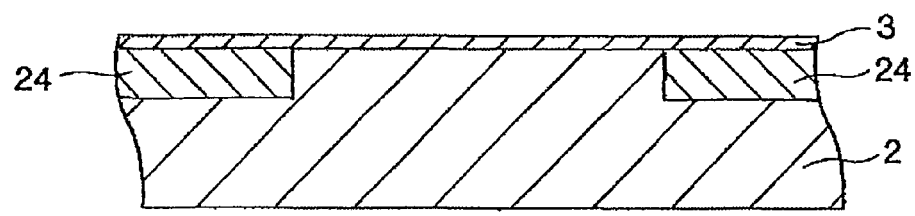

<3> Next, as shown in FIG. 4B, a gate insulating film 3 is formed on the semiconductor substrate 2. Here, a description will be representatively given for the case where the semiconductor substrate 2 is mainly formed of silicon.

I: Case where the gate insulating film 3 is formed of an insulative inorganic material containing nitrogen and/or carbon as an element X in addition to silicon and oxygen The gate insulating film 3 can be formed by diffusing the element X into a SiO$_2$ film (silicon oxide film) after forming the SiO$_2$ film, for example.

I-1: Formation of Silicon Oxide Film

First, the silicon oxide film is formed on the surface of a silicon substrate (semiconductor substrate 2) by means of a thermal oxidation method, a CVD (Chemical Vapor Deposition) method or the like, for example.

A: Thermal Oxidation Method

The thermal oxidation method is a method of forming a silicon oxide film on the surface of the silicon substrate (the semiconductor substrate 2) by supplying a gas containing oxygen atoms onto the silicon substrate heated. It is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 15 to 60 minutes. Further, as the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms.

B: CVD Method

The CVD method is a method of forming a silicon oxide film on the surface of the silicon substrate (the semiconductor substrate 2) by introducing a gas containing precursors to silicon oxide and oxygen atoms in a chamber to which a constant pressure is applied and heating the silicon substrate (the semiconductor substrate 2). As the precursors to silicon oxide, dichlorosilane, hexachloro disilanete, trakis (hydrocarbyl-amino)silane, tris(hydrocarbyl-amino)silane, and the like may be mentioned. One kind of these or combination of two or more kinds of these can be utilized as the precursors to silicon oxide.

As the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms. Further, it is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 20 to 60 minutes. Moreover, it is preferable that the pressure (degree of vacuum) in the chamber is in the range of about 0.05 (6.67 Pa) to 760 Torr (that is, atmosphere pressure, 1.013×10$^5$ Pa), and more preferably it is in the range of about 0.1 (13.3 Pa) to 500 Torr (6.67×10$^5$ Pa). Furthermore, it is preferable that a mixture ratio (mole ratio) of precursors to silicon oxide to a gas containing oxygen atoms is in the range of about 10:1 to 1:100, and more preferably it is in the range of about 1:2 to 1:10.

I-2: Diffusion of Element X

Next, the silicon substrate on which the silicon oxide film is formed is subject to heat treatment by supplying a gas containing nitrogen atoms and/or a gas containing carbon atoms (that is, a gas containing the element X) in place of a gas containing oxygen atoms in the above-mentioned step I-1. Thus, nitrogen and/or carbon diffuse into the silicon oxide (SiO$_2$) film, by which the gate insulating film 3 as a target can be obtained.

It is preferable that the temperature for the heat treatment is in the range of about 300 to 1,000° C., and more preferably it is in the range of about 600 to 900° C. Further, the time for the heat treatment is not particularly limited. For example, in the case where the heated temperature is set to the range described above, it is preferable that the time for the heat treatment is in the range of about 5 to 80 minutes, and more preferably it is in the range of about 10 to 50 minutes.

As for the gas containing nitrogen atoms, for example, ammonia, hydrazine, alkyl hydrazine compound, hydrogen azide, nitrogen monoxide, nitrogen dioxide, dinitrogen oxide, or the like may be mentioned. One kind of these or combination of two or more kinds of these can be utilized as the gas containing nitrogen atoms.

As for the gas containing carbon atoms, for example, carbon monoxide, carbon dioxide, or the like may be mentioned. One kind of these or combination of two or more kinds of these can be utilized as the gas containing carbon atoms.

Further, in this method I, the gas containing oxygen atoms and/or at least one of the gas containing nitrogen atoms and the gas containing carbon atoms (that is, the gas containing the element X) may be supplied to the silicon substrate in place of the gas containing oxygen atoms at the above-mentioned step I-1. This makes it possible to omit the above-mentioned step I-2.

II: Case where the gate insulating film 3 is formed of a material containing at least one of aluminum, hafnium, zirconium and germanium as an element X in addition to silicon and oxygen The gate insulating film 3 can be formed using a PVD method (Physical Vapor Deposition such as a vacuum evaporation method) such as a spattering method, a CVD (Chemical Vapor Deposition) method, or the like, for example.

In this case, by setting the concentration of the element X in a constituent material (raw material) to be used as a target, it is possible to adjust the concentration of the element X in the formed gate insulating film 3.

Here, as described above, hydrogen atoms normally intrude into the inside of the gate insulating film 3 at the manufacturing process thereof unavoidably. However, since the concentration of hydrogen atoms in such a case depends on the manufacturing method and the conditions thereof, the concentration of hydrogen atoms become substantially constant in the same manufacturing method and the same conditions thereof. Therefore, in the above-mentioned method I, the concentration of hydrogen atoms included inside the silicon oxide film is experimentally measured in advance on any method of manufacturing the silicon oxide film and any conditions thereof, and then, by appropriately setting the temperature for heat treatment, the time for heat treatment, the kind of gas to be used, the flow rate of the gas and the like in the above-mentioned step I-2 on the basis of the measured values, such conditions can be adjusted so that the concentration of the element X and the concentration of hydrogen in the gate insulating film 3 satisfy a predetermined relation.

In addition, the temperature for heat treatment, the time for heat treatment, the kind of gas to be used, the flow rate of the gas and the like can be experimentally obtained.

Further, in the above-mentioned method II, the concentration of hydrogen atoms included inside the gate insulating film 3 is experimentally measured in advance on any method of manufacturing the gate insulating film 3 and any conditions thereof, and then, by appropriately setting the concentration of the element X in a target to be used (raw material) and the like on the basis of the measured values, such conditions can be adjusted so that the concentration of the element X and the concentration of hydrogen in the gate insulating film 3 satisfy a predetermined relation.

Moreover, for example, heat treatment or the like may be applied to the obtained gate insulating film 3 in the atmosphere including water vapor ($H_2O$). In this case, it is preferable that the heating temperature is in the range of about 500 to 1,200° C., and more preferably it is in the range of about 700 to 1,000° C.

In the case where the heating temperature is set to be in the above range, it is preferable that the heating time is in the range of about 10 to 90 minutes, and more preferably it is in the range of about 20 to 60 minutes. Further, it is preferable that the relative humidity of the atmosphere is in the range of about 50 to 100% RH, and more preferably it is in the range of about 75 to 100% RH. By forming the gate insulating film 3 by means of the method and conditions described above, it is possible to interfuse the element other than silicon oxide into the gate insulating film 3 effectively. Thus, the obtained gate insulating film 3 has a region where the relation described above is satisfied more surely, in which the region is at least a part of the gate insulating film 3 in the thickness direction thereof. As a result, it is possible to prevent the occurrence of a leakage current and a dielectric breakdown due to the existing Si—OH structures 31 more surely.

In this regard, as a method of replacing each of hydrogen atoms in the gate insulating film 3 with a deuterium atom, for example, (A) a method of applying heat treatment to the gate insulating film 3 in the atmosphere including deuterium gas ($D_2$) after forming the gate insulating film 3; (B) a method of applying thermal oxidation to the semiconductor substrate 2 in the atmosphere including heavy water vapor ($D_2O$) when forming the gate insulating film 3; (C) a method of applying heat treatment to the gate insulating film 3 in the atmosphere including deuterated ammonia ($ND_3$) after forming the gate insulating film 3; or the like may be mentioned. One kind of these methods or combination of two or more kinds of these methods can be utilized as the method of replacing each of hydrogen atoms in the gate insulating film 3 with a deuterium atom.

Figure 4C:
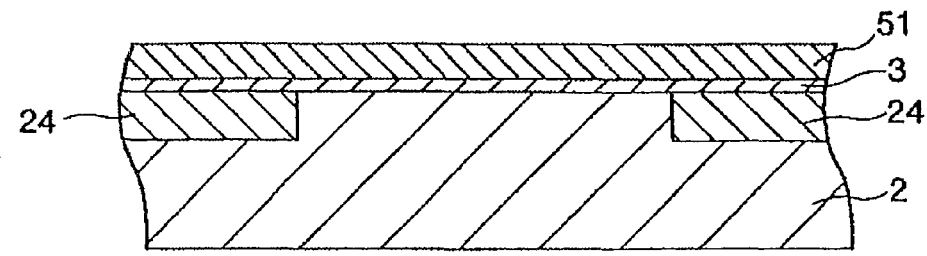

<4> Next, as shown in FIG. 4C, a conductive film 51 is formed on the gate insulating film 3. The conductive film 51 can be formed by depositing polycrystalline silicon or the like on the gate insulating film 3 with the CVD method, for example.

Figure 4D:
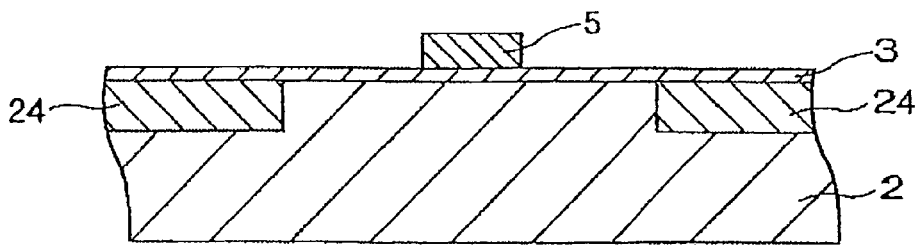

<5> Next, a resist mask corresponding to the shape of the gate insulating film 3 is formed on the conductive film 51 with a photolithography method or the like, for example. Then, unwanted portions of the conductive film 51 are eliminated via the resist mask with etching. Thus, it is possible to obtain the gate electrode 5 as shown in FIG. 4D. As this etching, physical etching method such as plasma etching, reactive etching, beam etching, photo assisted etching, chemical etching method such as wet etching, or the like may be mentioned. Further, One kind of these etching methods or combination of two or more kinds of these etching methods can be utilized as the etching.

Figure 4E:
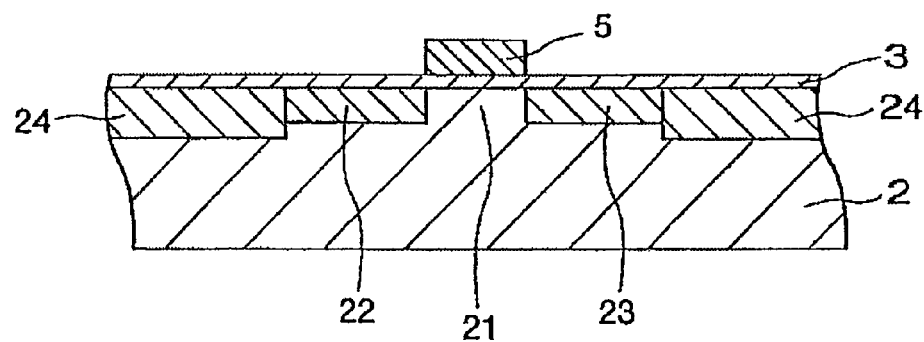

<6> Next, as shown in FIG. 4E, the source region 22 and the drain region 23 are formed by carrying out ion doping into both sides of the gate electrode 5 in the semiconductor substrate 2. At this time, in the case of forming the well with p-type impurities, the source region 22 and the drain region 23 are formed by doping n-type impurities such as $P^+$ into the both sides of the gate electrode 5. On the other hand, in the case of forming the well with n-type impurities, the source region 22 and the drain region 23 are formed by doping p-type impurities such as $B^+$ into the both sides of the gate electrode 5.

Figure 4F:
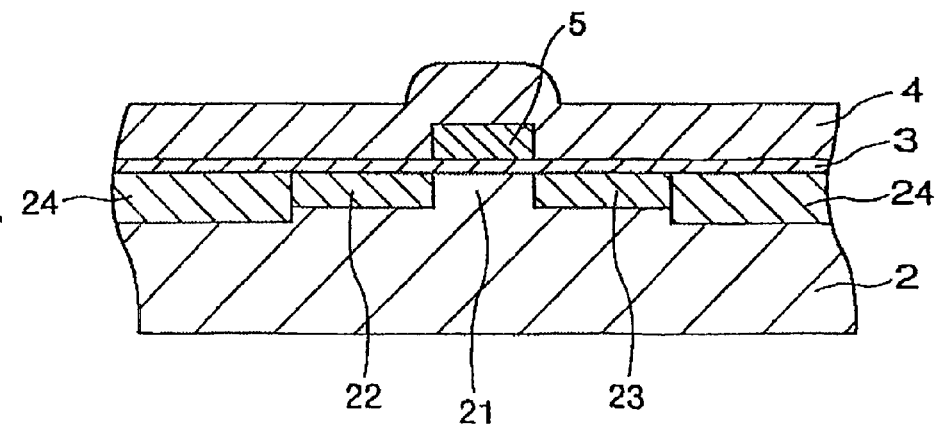

<7> Next, as shown in FIG. 4F, the interlayer insulating film 4 is formed by depositing $SiO_2$ or the like on the semiconductor substrate 2 on which the respective portions are formed with a CVD method or the like.

Figure 4G:
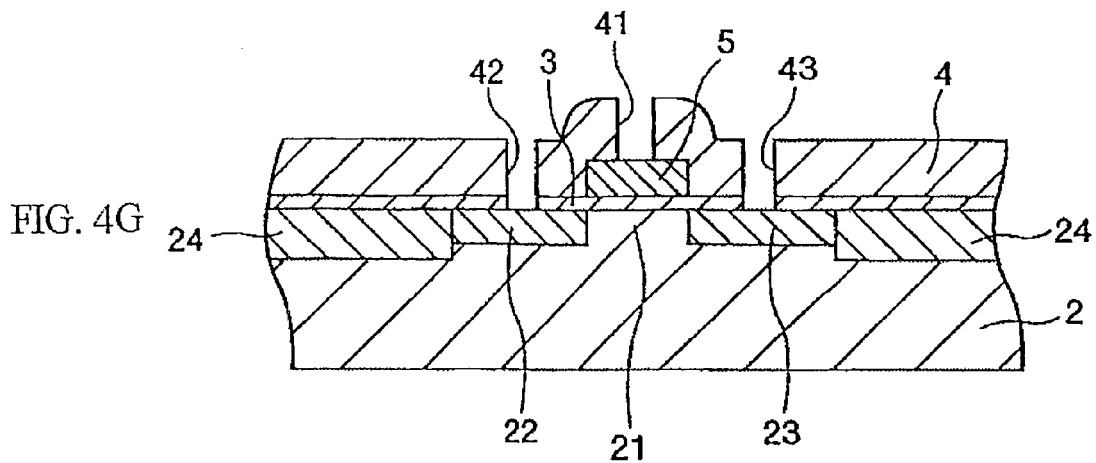

<8> Next, a resist mask in which portions corresponding to the contact holes opens is formed on the interlayer insulating film 4 with a photolithography method or the like, for example. Then, unwanted, portions of the interlayer insulating film 4 are eliminated via the resist mask with etching. Thus, as shown in FIG. 4G, the contact holes 41, 42, and 43 are formed so as to correspond to the channel region 21, the source region 22, and the drain region 23, respectively.

<9> Next, a conductive film is formed by depositing a conductive material on the interlayer insulating film 4 including the insides of the contact holes 41, 42, and 43 with a CVD method or the like, for example.

Figure 4H:
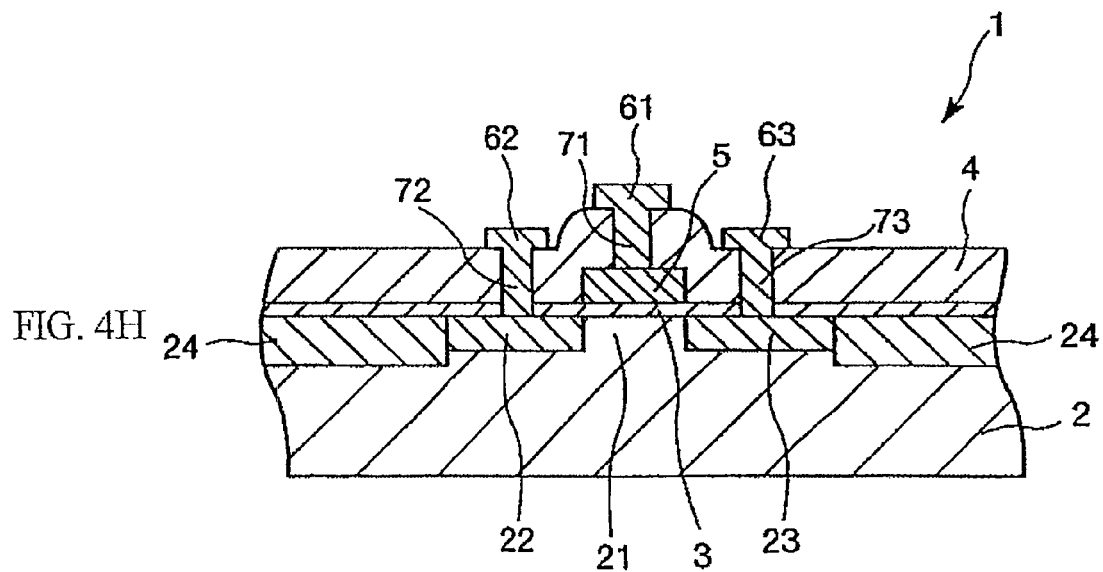

<10> Next, a resist mask corresponding to the shape of the conductive portion is formed on the conductive film with a photolithography method or the like, for, example. Then, unwanted portions of the conductive film are eliminated via the resist mask with etching. Thus, as shown in FIG. 4H, the conductive portions 61, 62, and 63 and the contact plugs 71, 72, and 73 are formed so as to correspond to the channel region 21, the source region 22, and the drain region 23, respectively.

Through the steps described above, the semiconductor device 1 is manufactured.

<Electronic Device>

The semiconductor device 1 described above is applied to various types of electronic devices. Hereinafter, a case where an electronic device of the present invention including the semiconductor device 1 of the present invention is applied to a transmission liquid crystal display (LCD) will now be described as a representative example.

Figure 5:
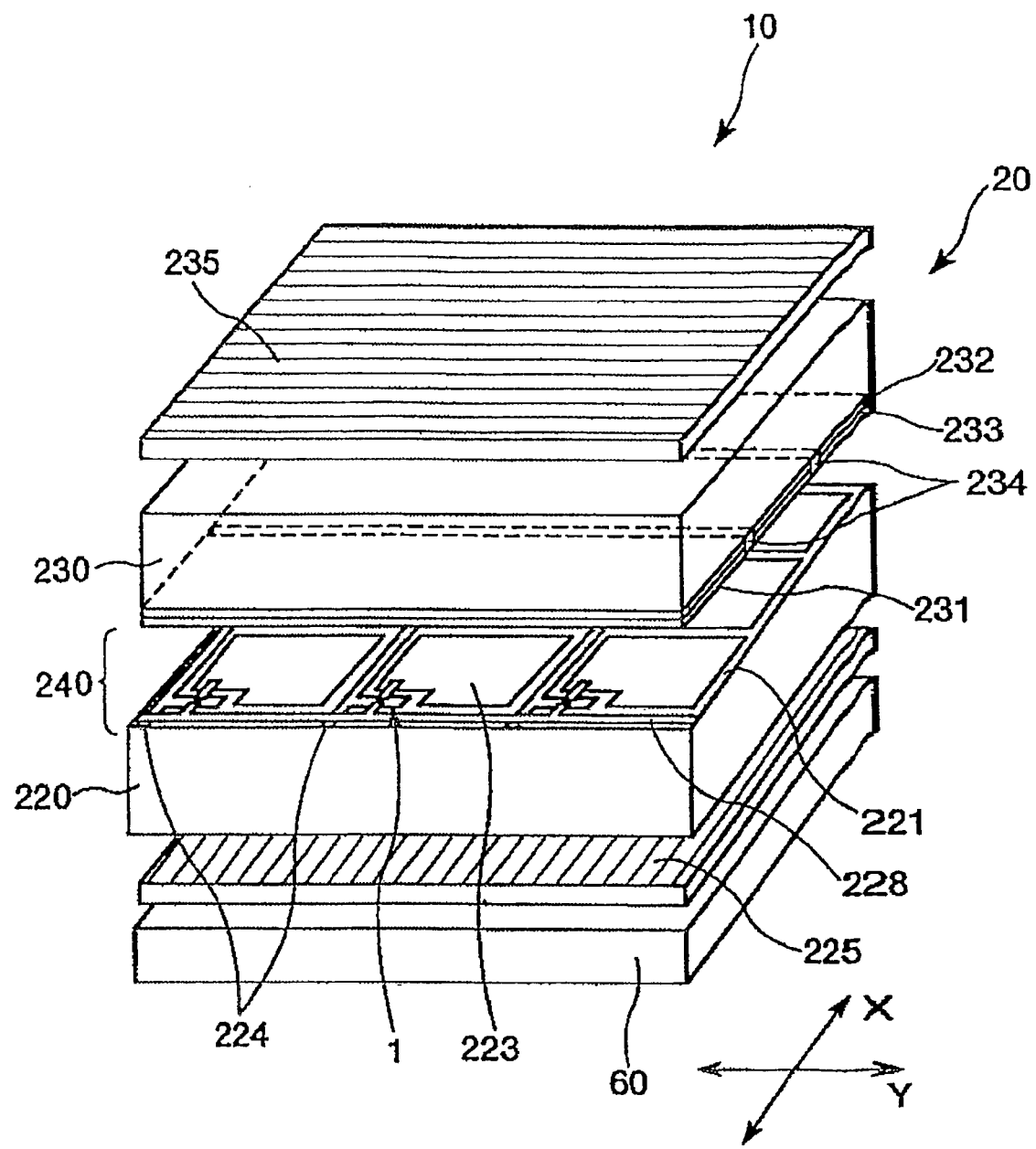
FIG. 5 is an exploded perspective view which shows an embodiment of an electronic device in the case of applying an electronic device of the present invention to a transmission liquid crystal display.
Figure 6:
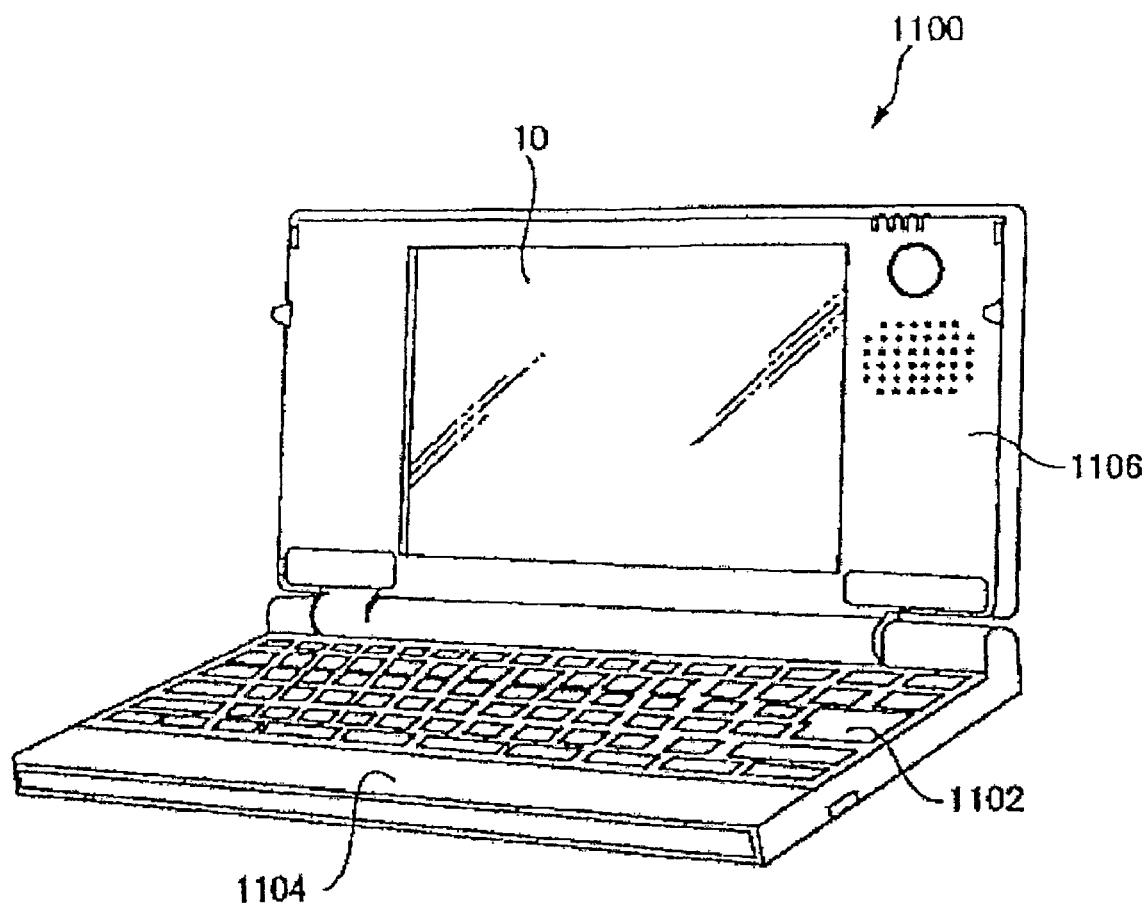
FIG. 6 is a perspective view which shows a structure of a mobile (or laptop type) personal computer to which an electronic apparatus of the present invention is applied.

FIG. 5 is an exploded perspective view which shows an embodiment of an electronic device in the case of applying an electronic device of the present invention to a transmission liquid crystal display. In this regard, some members (components) of the transmission LCD in FIG. 5 are omitted in order to avoid complication of the drawings. Further, in following explanations using FIG. 5, for convenience of explanation, an upper side and lower side in FIG. 6 are referred to as "upper" and "lower", respectively.

This transmission liquid crystal display 10 shown in FIG. 5 (hereinafter, the transmission liquid crystal display 10 will be referred to simply as "liquid crystal display 10") includes a liquid crystal panel (display panel) 20, and a backlight (light source) 60.

The liquid crystal display 10 can display an image (information) by transmitting light from the backlight 60 to the liquid crystal panel 20.

The liquid crystal panel 20 has a first plate 220 and a second plate 230 that are provided so as to face each other. Further, a seal member (not, shown) is provided between the first and second plate 220, 230 so that a display area is surrounded by the seal member.

A liquid crystal that is an electro-optical material is received in a space defined by the first plate 220, the second plate 230, and the seal member, thereby forming a liquid crystal layer (intermediary layer) 240. Namely, the liquid crystal layer 240 is inserted between the first plate 220 and the second plate 230.

Although illustrative representation is omitted, an orientational film constituted from polyimide, for example, is provided on each of upper and lower surfaces of the liquid crystal layer 240. Orientation (orientational direction) of liquid crystal molecules constituting the liquid crystal layer 240 is controlled by these orientational films.

Each of the first plate 220 and the second plate 230 is formed of one of various kinds of glass materials, various kinds of resin materials, and the like, for example.

The first plate 220 is provided with a plurality of picture electrodes 223 arranged in a matrix manner on the top surface 221 thereof (that is, the surface facing the liquid crystal layer 240), scanning lines 224 each extending in an X direction of FIG. 5, and signal lines 228 each extending in a Y direction of FIG. 5.

Each of the picture electrodes 223 is constituted from a transparent conductive film having transparency (optical transparency), and connected to one scanning line 224 and one signal line 228 via one semiconductor device (that is, a semiconductor device of the present invention) 1. A polarizing plate 225 is provided on the lower surface of the first plate 220. On the other hand, the second plate 220 is provided with opposing electrodes 232 constituted from a plurality of strip on the lower surface 231 thereof (that is, the surface facing the liquid crystal layer 240). These opposing electrodes 232 are arranged in substantially parallel to each other so as to space by a predetermined distance each other and to face the picture electrode 223.

A portion where the picture electrode 223 and the opposing electrode 232 are overlapped with each other (which includes an adjacent portion) constitutes one pixel. By charging and discharging between the picture electrode 223 and the opposing electrode 232, in every pixel, the liquid crystal of the liquid crystal layer 240 is driven, that is, an orientational state of the liquid crystal is changed.

The opposing electrode 232 is also constituted from a transparent conductive film having transparency (optical transparency) as well as the picture electrode 223.

Each of three colored layers including red (R), green (G) and blue (B) (color filter) 233 is provided on the lower surface of each of the opposing electrodes 232. These colored layers 233 are divided by a black matrix 234.

The black matrix 234 has a light blocking effect, and is formed of, for example, a metal such as chromium, aluminum, aluminum alloy, nickel, zinc, titanium, or a resin in which carbon or the like is dispersed. Further, a polarizing plate 235 of which the deflecting axis is different from that of the polarizing plate 225 is provided on the upper surface of the second plate 230.

In the liquid crystal panel 20 having such a structure, light emitting from the backlight 60 enters the liquid crystal layer 240 through the first plate 220 and the picture electrodes 223 after deflected with the polarizing plate 225. The intensity of the light entering the liquid crystal layer 240 is modulated with the liquid crystal in which orientational state of each of pixel is controlled. The intensity-modulated light passes through the colored layer 233, the opposing electrodes 232 and the second plate 230, and then deflected with the polarizing plate 235 to exit outside the liquid crystal display 10. Thus, in the liquid crystal display 10, it is possible to view a color image (including both a moving image and a still image) such as letter, numeric character, and figure (graphic form) from the opposite side to the liquid crystal layer 240 of the second plate 230.

In this regard, in the explanation described above, a case where the electronic device of the present invention is applied to an active matrix driving type of transmission liquid crystal device has been described as a representative example. However, the present invention is not limited thereto. In addition, it is possible to apply the electronic device of the present invention to a reflective liquid crystal display, organic or inorganic electroluminescence display, and an electrophoretic display.

<Electronic Device>

The liquid crystal display 10 described above (electronic device of the present invention) can be utilized as a display portion of each of various types of electronic apparatuses.

FIG. 6 is a perspective view which shows a structure of a mobile (or laptop type) personal computer to which an electronic apparatus of the present invention is applied. Referring to FIG. 6, a personal computer 1100 is provided with a body 1104 having a keyboard 1102, and a display unit 1106. The display unit 1106 is rotatably supported on the body 1104 via a hinge portion. In this personal computer 1100, the display unit 1106 is provided with the liquid crystal display (electro-optical device) 10 described above.

Figure 7:
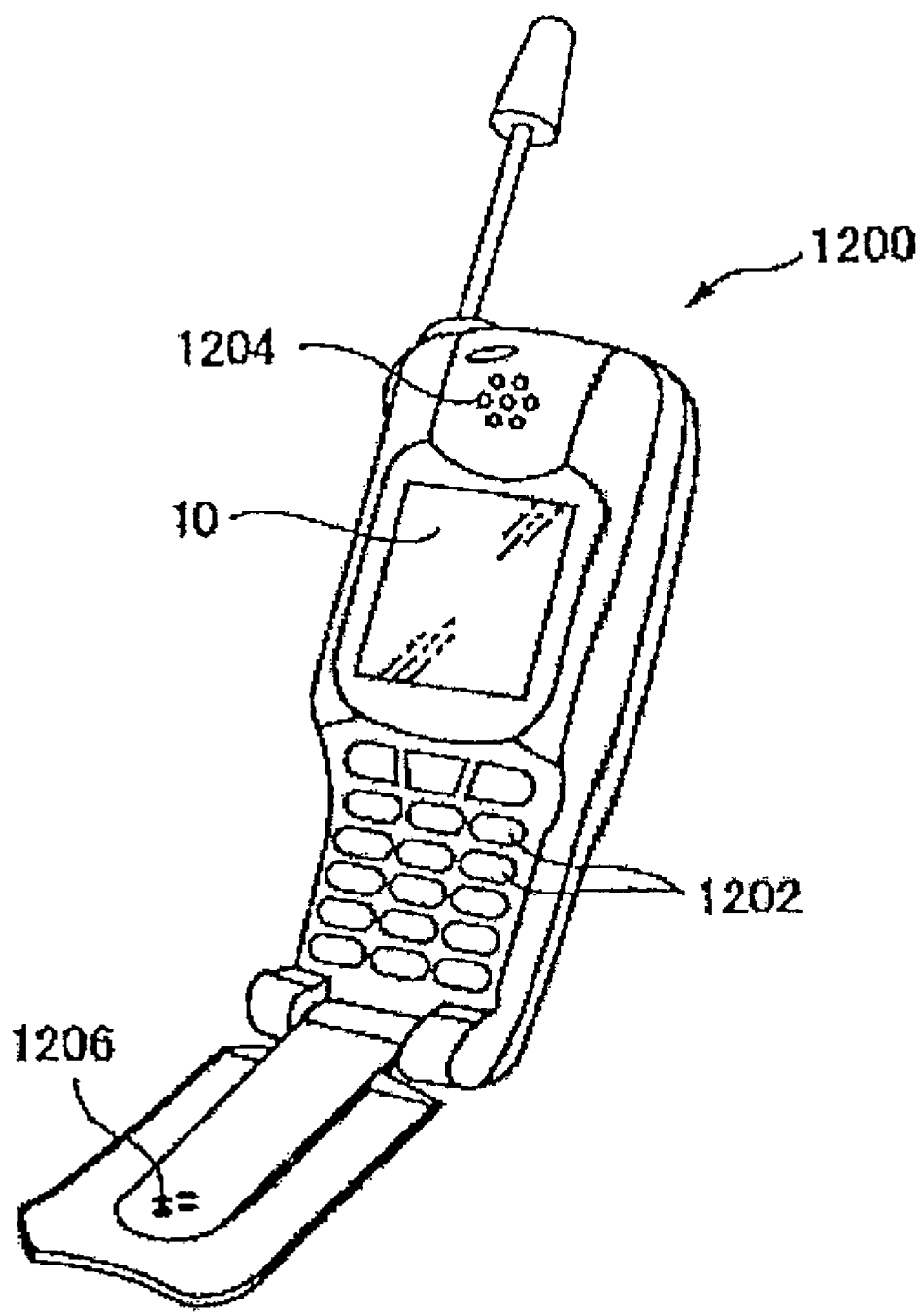
FIG. 7 is a perspective view which shows a structure of a portable phone (including a personal handyphone system) to which an electronic apparatus of the present invention is applied.

FIG. 7 is a perspective view which shows a structure of a portable phone (including a personal handyphone system) to which an electronic apparatus of the present invention is applied. Referring to FIG. 7, a portable phone 1200 is provided with a plurality of buttons 1202, an earpiece 1204, a mouthpiece 1206, and a display portion. The display portion is constituted from the liquid crystal display (electro-optical device) 10 described above.

Figure 8:
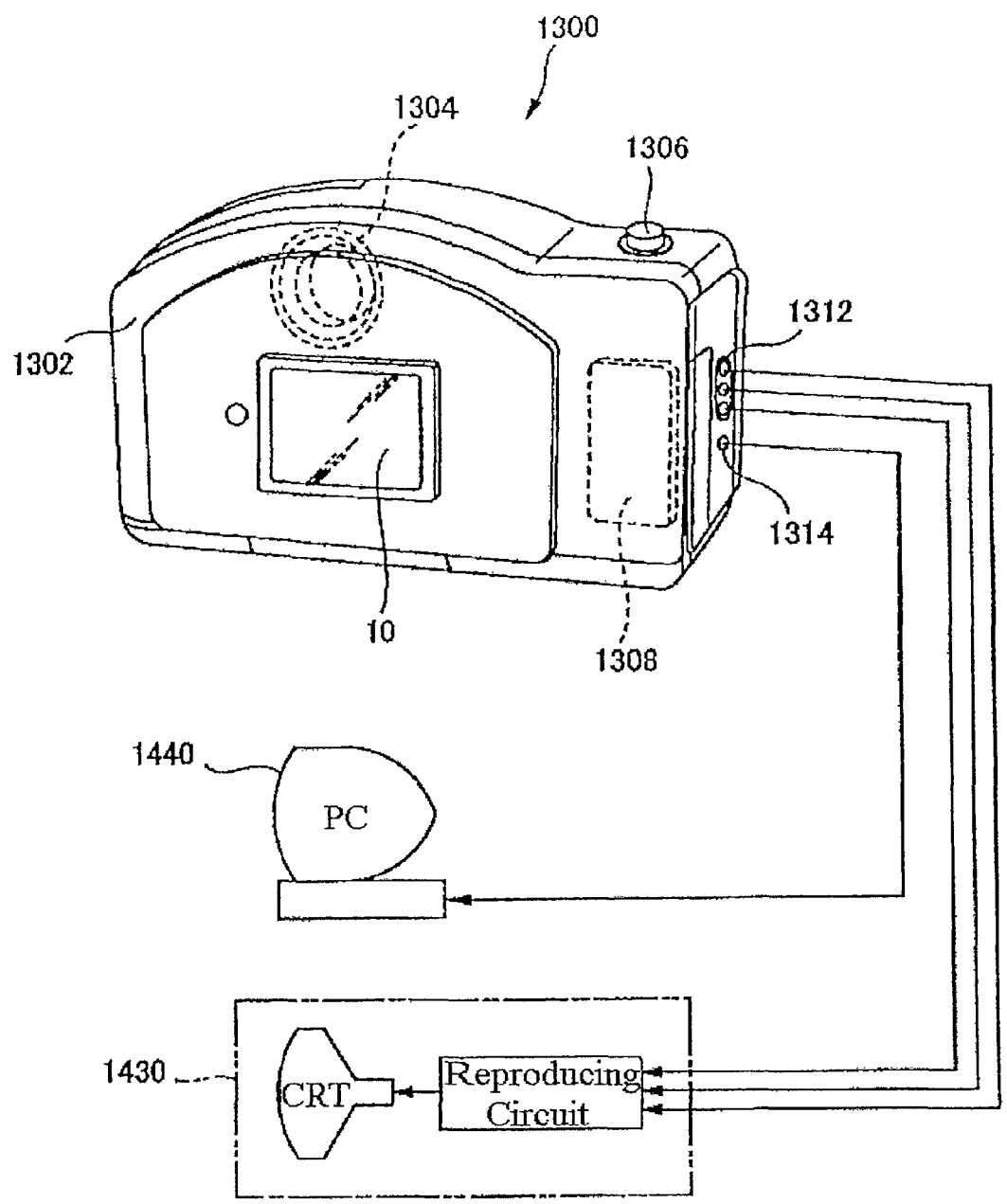
FIG. 8 is a perspective view which shows a structure of a digital still camera to which an electronic apparatus of the present invention is applied.

FIG. 8 is a perspective view which shows a structure of a digital still camera to which an electronic apparatus of the present invention is applied. In this drawing, connection of the digital still camera to external equipments thereof is schematically shown. A normal camera exposes a silver salt photographic film on the basis of an optical image of a subject, while the digital still camera 1300 generates an imaging signal (image signal) by photoelectrically converting an optical image of a subject into the imaging signal with imaging device such as a charge coupled device (CCD).

The liquid crystal display 10 described above is provided as a display portion on the back surface of a case (body) 1302 in the digital still camera 1300. The liquid crystal display 10 displays an image in response to an imaging signal by the CCD, and serves as a finder for displaying a subject as an electronic image. A circuit board 1308 is placed inside the case 1302. A memory capable of storing an imaging signal is placed on the circuit board 1308. Further, a light receiving unit 1304 including an optical lens (imaging optical system), the CCD, and the like is provided in the front surface side of the case 1302.

When a photographer confirms an image of a subject displayed on the display portion, and pushes a shutter button 1306, an imaging signal of the CCD at the time is transferred to the memory of the circuit board 1308 and stored in this memory.

Further, a video signal output terminal 1312 and an input/output terminal 1314 for data communication are provided on the side surface of the case 1302 in the digital still camera 1300. As shown in FIG. 8, a television monitor 1430 and a personal computer 1440 are respectively connected to the video signal output terminal 1312 and the input/output terminal 1314 for data communication if needed. Moreover, the imaging signal stored in the memory of the circuit board 1308 is outputted to the television monitor 1430 or the personal computer 1440 with a predetermined operation.

In this regard, the electronic apparatus of the present invention can be suitably used in (or applied to), for example, televisions, video cameras, view finder type or monitor direct view type videotape recorders, laptop type personal computers, car navigation devices, pagers, electronic notebooks (including those having communication functions), electronic dictionaries, pocket calculators, electronic game devices, word processors, work stations, television telephones, television monitors for crime prevention, electronic binoculars, POS (point-of-sale) terminals, apparatuses with touch panel (for example, cash dispensers in a financial institutions, automatic ticket vending machines), medical devices (electronic thermometers, blood pressure meters, blood sugar meters, electrocardiogram displaying devices, ultrasound diagnostic devices, displays for endoscopes, for example), fish finders, various measurement devices, gauges (gauges for vehicles, airplanes, ships and the like, for example), flight simulators, any other types of monitors, projection type displays such as projectors and the like, in addition to the personal computer (mobile personal computer) 1100 shown in FIG. 6, the portable phone 1200 shown in FIG. 7 and the digital still camera 1300 shown in FIG. 8.

The semiconductor device, the electronic device, and the electronic apparatus according to the present invention have been described based on the embodiment shown in the drawings, but it should be noted that the present invention is not limited to the embodiment. Respective portions of the semiconductor device, the electronic device, and the electronic apparatus can be replaced with an arbitrary arrangement capable of functioning in the same manner. Further, any other arbitrary component may be added to the semiconductor device, the electronic device, and the electronic apparatus of the present invention.

EXAMPLE

Next, a concrete example of the present invention will be described.

1. Manufacturing and Evaluation of Insulating Film
1-1. Manufacturing of Insulating Film
Five insulating films were formed in each of Examples 1 to 13 and Comparative Example that will be described below.

Example 1

—1A— A surface direction (100) p-type silicon crystal substrate (Si(100) substrate, that is, a base) was first prepared. The silicon crystal substrate was subject to a thermal oxidation process, and then a silicon oxynitride film (foundation layer) was formed with a CVD method. The thermal oxidation process was carried out for fifteen minutes in the atmosphere of water vapor ($H_2O$) having relative humidity of 33% RH at 750° C. The average thickness Y of the obtained silicon oxide film was 5.5 nm.

—2A— Next, this silicon oxide film was subject to heat treatment that was carried out for 10 minutes in the atmosphere of ammonia ($NH_3$) at 850° C. By carrying out the steps as described above, an insulating film was obtained.

Example 2

By carrying out the steps as well as Example 1 described above except that the conditions of the heat treatment in the atmosphere of ammonia ($NH_3$) in the step —2A— described above were changed from 850° C.×10 minutes to 750° C.×10 minutes, an insulating film having an average thickness Y of 5.3 nm was obtained.

Example 3

By carrying out the steps as well as Example 1 described above except that the conditions of the heat treatment in the atmosphere of ammonia ($NH_3$) in the step —2A— described above were changed from 850° C.×10 minutes to 900° C.×15 minutes, an insulating film having an average thickness Y of 5.5 nm was obtained.

Example 4

By carrying out the steps as well as Example 1 described above except that the conditions of the heat treatment in the atmosphere of ammonia ($NH_3$) in the step —2A— described above were changed from 850° C.×10 minutes to 450° C.×5 minutes, an insulating film having an average thickness Y of 5.3 nm was obtained.

Example 5

By carrying out the steps as well as Example 1 described above except for the atmosphere of carbon dioxide ($C_2O$) in place of the atmosphere of water vapor ($H_2O$) in the step —2A— described above, an insulating film having an average thickness Y of 5.2 nm was obtained.

Example 6

By carrying out the steps as well as Example 2 described above except for the atmosphere of carbon dioxide ($C_2O$) in place of the atmosphere of water vapor ($H_2O$) in the step —2A— described above, an insulating film having an average thickness Y of 5.3 nm was obtained.

Example 7

By carrying out the steps as well as Example 3 described above except for the atmosphere of carbon dioxide ($C_2O$) in place of the atmosphere of water vapor ($H_2O$) in the step —2A— described above, an insulating film having an average thickness Y of 5.4 nm was obtained.

Example 8

By carrying out the steps as well as Example 4 described above except for the atmosphere of carbon dioxide ($C_2O$) in place of the atmosphere of water vapor ($H_2O$) in the step —2A— described above, an insulating film having an average thickness Y of 5.2 nm was obtained.

Example 9

By carrying out the steps as well as Example 1 described above except for the atmosphere of heavy water vapor ($D_2O$) in place of the atmosphere of water vapor ($H_2O$) in the step —1A— described above, an insulating film having an average thickness Y of 5.5 nm was obtained.

Example 10

—1B— A surface direction (100) p-type silicon crystal substrate (Si(100) substrate, that is, a base) was first prepared. A silicon oxide film containing aluminum was formed on the prepared substrate by means of a spattering method. In this regard, the spattering method was carried out at the pressure in a chamber of $3\times10^{-3}$ Torr (0.400 Pa) using a material constituted from silicon dioxide and aluminum as a target and argon gas as a gas for discharge. The average thickness Y of the obtained silicon oxide film was 5.0 nm.

—2B— Next, this silicon oxide film was subject to heat treatment that was carried out in the atmosphere of water vapor ($H_2O$) having relative humidity of 95% RH at 900° C. for five minutes. By carrying out the steps as described above, an insulating film was obtained.

Example 11

By carrying out the steps as well as Example 10 described above except for using a material constituted from silicon dioxide and hafnium in place of the material constituted from silicon dioxide and aluminum in the step —1B— described above, an insulating film having an average thickness Y of 5.3 nm was obtained.

Example 12

By carrying out the steps as well as Example 10 described above except for using a material constituted from silicon dioxide and zirconium in place of the material constituted from silicon dioxide and aluminum in the step —1B— described above, an insulating film having an average thickness Y of 4.8 nm was obtained.

Example 13

By carrying out the steps as well as Example 10 described above except for using a material constituted from silicon dioxide and germanium in place of the material constituted from silicon dioxide and aluminum in the step —1B— described above, an insulating film having an average thickness Y of 5.1 nm was obtained.

Comparative Example

By carrying out the steps as well as Example 1 described above except to omit the step —2A— described above, an insulating film having an average thickness of 5.2 nm was obtained.

1-2. Evaluation for Insulating Film 1-2-1. Secondary Ion Mass Spectrometry

The ion intensity of silicon and oxygen toward the thickness direction from a surface of the insulating film opposite to the surface thereof that was in contact with the base (this surface was defined as the thickness of 0 nm), and the concentration (or degree of density) of hydrogen (deuterium), nitrogen, carbon, aluminum, hafnium, zirconium and germanium were measured by means of a Secondary Ion Mass Spectrometry method with respect to each of Examples 1 to 13 and Comparative Example.

In this case, the measurement conditions of the Secondary Ion Mass Spectrometry method were as follows.

Figure 9:
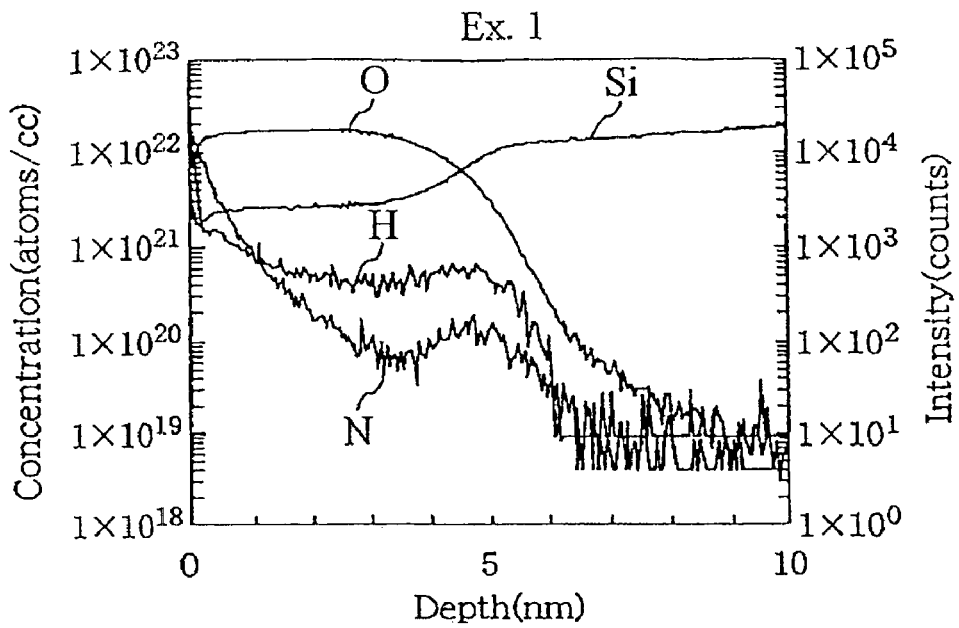
FIG. 9 is a profile which shows each of the constituent elements of the insulating film of Example 1 when measuring the insulating film with Secondary Ion Mass Spectrometry.
Figure 10:
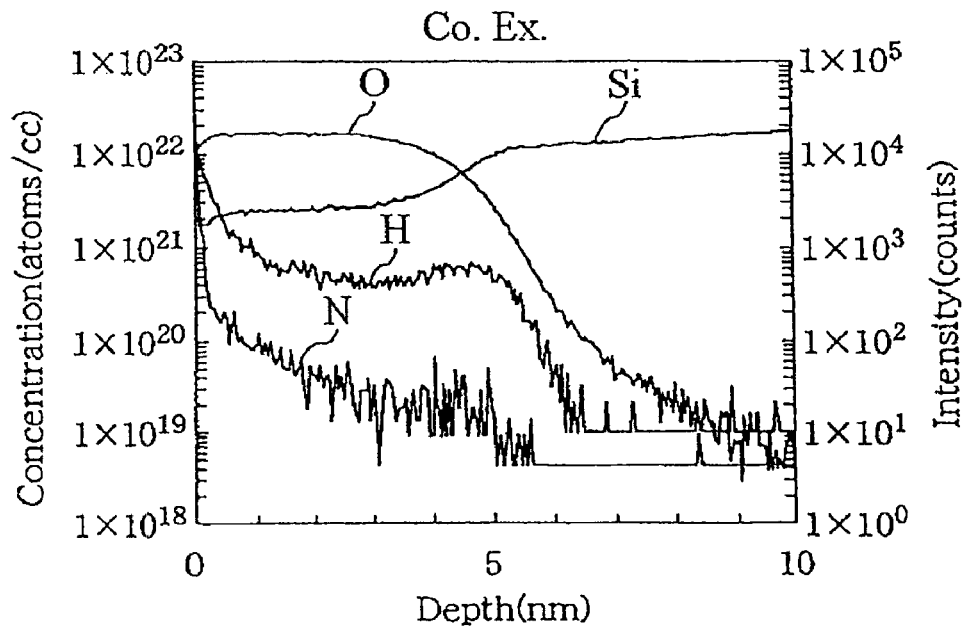
FIG. 10 is a profile which shows each of the constituent elements of the insulating film of Comparative Example 1 when measuring the insulating film with Secondary Ion Mass Spectrometry.

SIMS apparatus: ADEPT1010 (made by Physical Electronics)
primary ion species: $Cs^+$
accelerating energy for primary ion: 500 eV
secondary ion polarity: positive As an example, the measurement results of Example 1 and Comparative Example were shown in FIGS. 9 and 10. FIG. 9 is a profile which shows each of the constituent elements of the insulating film of Example 1 when measuring the insulating film with Secondary Ion Mass Spectrometry. FIG. 10 is a profile which shows each of the constituent elements of the insulating film of Comparative Example 1 when measuring the insulating film with Secondary Ion Mass Spectrometry.

Next, the value B/A described above at predetermined distances (that is, Y/3, Y/5 and Y/10 (nm)) from an interface between the base and the insulating film obtained in each of Examples 1 to 13 and Comparative Example was shown in TABLE 1 described below. In this regard, each of the numerical values in TABLE 1 was a value obtained on the basis of the measurement results (for example, carrying out the corrections), and was an average value of five different samples of each insulating film.

TABLE 1

| | Constituent material of insulating film | B/A value at predetermined distances from interface | | |
|---|---|---|---|---|
| | | Y/3 | Y/5 | Y/10 |
| Ex. 1 | Silicon, oxygen, nitrogen | 12.3 | 9.5 | 1.8 |
| Ex. 2 | Silicon, oxygen, nitrogen | 15.4 | 10.7 | 4.5 |
| Ex. 3 | Silicon, oxygen, nitrogen | 2.5 | 2.1 | 1.8 |
| Ex. 4 | Silicon, oxygen, nitrogen | 16.3 | 12.3 | 8.6 |
| Ex. 5 | Silicon, oxygen, carbon | 15.5 | 4.6 | 4.5 |
| Ex. 6 | Silicon, oxygen, carbon | 16.6 | 11.8 | 7.4 |
| Ex. 7 | Silicon, oxygen, carbon | 4.5 | 3.5 | 3.3 |
| Ex. 8 | Silicon, oxygen, carbon | 17.1 | 14.0 | 9.3 |
| Ex. 9 | Silicon, oxygen, nitrogen (deuterated) | 10.3 | 8.3 | 1.6 |
| Ex. 10 | Silicon, oxygen, aluminum | 5.5 | 5.3 | 4.9 |
| Ex. 11 | Silicon, oxygen, hafnium | 2.8 | 2.5 | 1.8 |
| Ex. 12 | Silicon, oxygen, zirconium | 4.8 | 4.5 | 3.7 |
| Ex. 13 | Silicon, oxygen, germanium | 8.5 | 8.3 | 7.9 |
| Co. Ex. | Silicon, oxygen | 18.9 | 14.3 | 12.5 |

In this regard, A was the concentration of an element X (atoms/cc), B is the concentration of hydrogen atoms (atoms/cc), and Y is the average thickness of the insulating film (nm)

1-2-2. Measurement of Leakage Current

Next, changes in the leakage current values was measured with respect to each of Examples 1 to 6 and Comparative Examples 1 to 5 when the electric field intensity (that is, the applied voltage value) to each insulating film was changed. In this case, the measured area was determined to be 0.02039 $cm^2$.

The maximum values of the leakage current measured when the electric field intensity was in the range of 0 to −3 MV/cm in the insulating films obtained in each of Examples 1 to 13 and Comparative Example are shown in TABLE 2 described below. In this regard, each of the numerical values in TABLE 2 was an average value of the five different samples of each insulating film. Further, as an example, a graph which showed the relation between change in the electric field intensity measured with respect to each of Examples 1 to 13 and Comparative Example and change in the leakage current value at that time was shown in FIG. 11. FIG. 11 is a graph which shows a relationship between a change in electric field intensity and a change in a leakage current both measured in the insulating films of Example 1 and Comparative Example 1.

TABLE 2

| | Constituent material of insulating film | Maximum Value of Leakage Current ($A/cm^2$) |
|---|---|---|
| Ex. 1 | Silicon, oxygen, nitrogen | $6 \times 10^{-9}$ |
| Ex. 2 | Silicon, oxygen, nitrogen | $7 \times 10^{-9}$ |
| Ex. 3 | Silicon, oxygen, nitrogen | $6 \times 10^{-9}$ |
| Ex. 4 | Silicon, oxygen, nitrogen | $1.0 \times 10^{-8}$ |
| Ex. 5 | Silicon, oxygen, carbon | $7 \times 10^{-9}$ |
| Ex. 6 | Silicon, oxygen, carbon | $8 \times 10^{-9}$ |
| Ex. 7 | Silicon, oxygen, carbon | $7 \times 10^{-9}$ |
| Ex. 8 | Silicon, oxygen, carbon | $1.8 \times 10^{-8}$ |
| Ex. 9 | Silicon, oxygen, nitrogen (deuterated) | $4 \times 10^{-9}$ |
| Ex. 10 | Silicon, oxygen, aluminum | $7 \times 10^{-9}$ |
| Ex. 11 | Silicon, oxygen, hafnium | $6 \times 10^{-9}$ |
| Ex. 12 | Silicon, oxygen, zirconium | $7 \times 10^{-9}$ |
| Ex. 13 | Silicon, oxygen, germanium | $9 \times 10^{-9}$ |
| Co. Ex. | Silicon, oxygen | $3.0 \times 10^{-8}$ |

As shown in TABLE 2 and FIG. 11, the leakage current value in the insulating film of each of Examples 1 to 13 when the electric field intensity was in the range of 0 to −5 MV/cm (in particular, in the range of 0 to −3 MV/cm) was restricted to a low value. In addition, in each of Examples in which the B/A value was low the leakage current value tended to be restricted to a lower value in particular. On the other hand, in the insulating film of Comparative Example, a large leakage current flowed even at lower electric field intensity.

1-2-3. Measurement of Qbd Value

Next, the Qbd value was measured with respect to the insulating film of each of Examples 1 to 13 and Comparative Example. Here, the "Qbd value" meant total electrical charges (that is, total amount of current) which flowed in the insulating film in the thickness direction thereof when a dielectric breakdown occurred. The larger the Qbd value was, the more difficultly a dielectric breakdown occurred. In this measurement of the Qbd value, when a constant current was supplied to an insulating film using mercury electrodes, a time point when a small change in voltage occurred first time is determined to be the SBD, and a time point when a drastic change in voltage occurred is determined to be the HBD. Total electrical charges (Qbd value (SBD)) that passed through the insulating film until a SBD occurred and total electrical charges (Qbd value (HBD)) that passed through the insulating film until a HBD occurred were measured. In this case, the measured area was determined to be 0.02039 $cm^2$, and a constant current value applied to the insulating film was determined to be 0.01226 $A/cm^2$.

The Qbd value (SBD) and the Qbd value (HBD) thus measured in the insulating film of each of Examples 1 to 13 and Comparative Example are shown in TABLE 3 described below. In this regard, each of the numerical values in TABLE 3 was an average value of the five different samples of each insulating film.

TABLE 3

| | Constituent material of insulating film | Qbd value ($C/cm^2$) | |
|---|---|---|---|
| | | SBD | HBD |
| Ex. 1 | Silicon, oxygen, nitrogen | 86 | 286 |
| Ex. 2 | Silicon, oxygen, nitrogen | 81 | 277 |
| Ex. 3 | Silicon, oxygen, nitrogen | 85 | 283 |
| Ex. 4 | Silicon, oxygen, nitrogen | 70 | 180 |
| Ex. 5 | Silicon, oxygen, carbon | 80 | 275 |
| Ex. 6 | Silicon, oxygen, carbon | 78 | 255 |
| Ex. 7 | Silicon, oxygen, carbon | 83 | 278 |
| Ex. 8 | Silicon, oxygen, carbon | 52 | 133 |
| Ex. 9 | Silicon, oxygen, nitrogen (deuterated) | 90 | 301 |
| Ex. 10 | Silicon, oxygen, aluminum | 84 | 279 |
| Ex. 11 | Silicon, oxygen, hafnium | 85 | 286 |
| Ex. 12 | Silicon, oxygen, zirconium | 80 | 276 |
| Ex. 13 | Silicon, oxygen, germanium | 76 | 220 |
| Co. Ex. | Silicon, oxygen | 20 | 71 |

As shown in TABLE 3, the Qbd value (SBD) of the insulating film in each of Examples 1 to 13 was larger than the Qbd value (SBD) of the insulating film in Comparative Example. Further, the Qbd value (HBD) of the insulating film in each of Examples 1 to 13 was larger than the Qbd value (HBD) of the insulating film in Comparative Example as well as the Qbd value (SBD). Moreover, in each of Examples in which the B/A value was low both the Qbd value (SBD) and the Qbd value (HED) tended to become larger in particular.

From each of evaluation results described above, it become apparent that the insulating film having a region where the concentration A of the element X and the concentration B of hydrogen satisfied the relation: the value B/A was 10 or less had superior resistance to a dielectric breakdown. Further, the tendency that the resistance to a dielectric breakdown of the insulating film was improved as the value B/A become smaller was shown in the insulating film having such a region.

2. Manufacturing and Evaluation of Semiconductor Device 2-1. Manufacturing of Semiconductor Device The semiconductor device shown in FIG. 1 was manufactured in accordance with the method described in the embodiment described above. In this case, the gate insulating film was formed as well as each of Examples 1 to 13 and Comparative Example described above.

2-2. Evaluation for Semiconductor Device

To evaluate the switching characteristics of each semiconductor device provided with a gate insulating film formed in the same manner as each of Example 1 to 13 and Comparative Example, a threshold of each gate insulating film was measured.

As a result, the absolute value of the threshold voltage had become lower for a long time in the semiconductor device including each of the gate insulating films formed in the same manner as Examples 1 to 13. Further, the semiconductor devices thus manufactured showed the tendency that the smaller the B/A value at the region closer to the interface between the base and the gate insulating film was controlled, the smaller the absolute value of the threshold voltage become. This implied that the deterioration of the characteristics of the gate insulating film was prevented as the gate insulating film contained the element X in the vicinity of the interface effectively.

On the other hand, in the semiconductor device including the gate insulating film formed in the same manner as Comparative Example, a leakage current was recognized and the switching characteristics were unstable (that is, the threshold voltage become larger). Thus, a dielectric breakdown occurred in the gate insulating film early, and a function as a switching device was lost. Here, the threshold voltage meant a gate voltage value when the value of an approximation formula (relational expression) indicating the relation between the gate voltage and $Id^{1/2}$ (where Id is a drain current value) become zero, and was substantially the same as the gate voltage required for the drain current to start flowing.

In this regard, such an insulating film having a feature that the B/A value in the region closer to the interface between the insulating film and a base is low is an insulating film in which the generation of Si—OH structures 31 is prevented effectively while the absolute quantity of elements X is controlled to be low in the insulating film.

As described above, it is to be understood that such an insulating film has an excellent feature while effectively preventing a dielectric breakdown (such as SBD, SILC) from occurring.

What is claimed is:

1. A method for manufacturing a semiconductor device comprising:
    preparing a base made of a semiconductor material;
    forming a silicon oxide film including either hydrogen or deuterium on the base;
    diffusing nitrogen into the silicon oxide film to thereby form a gate insulating film comprising silicon oxide including the nitrogen and either the hydrogen or deuterium;
    forming a gate electrode on the gate insulating film;
    carrying out ion doping in the base such that a source region and a drain region are formed at both sides of a channel region of the base which is in contact with the gate electrode through the gate insulating film; and
    forming a source electrode electrically connecting to the source region of the base and a drain electrode electrically connecting to the drain region of the base to thereby obtain the semiconductor device;
    wherein by diffusing the nitrogen into the silicon oxide film in the diffusing step, the amount of either the hydrogen or deuterium residing in the vicinity of an interface between the formed gate insulating film and the base is relatively reduced so that the gate insulating film has a first region where B/A is in the range of 1.6 to 8.6, where a concentration of the nitrogen in the region being defined as A, and a concentration of the hydrogen or the deuterium in the region being defined as B, and
    wherein the first region is located at a portion of the gate insulating film at a first distance toward a thickness direction of Y/10 of the gate insulating film from the interface, where Y is an average thickness of the gate insulating film, and
    wherein the gate insulating film has a second region where the B/A is in the range of 10.3 to 16.3, and the second region is located at a portion of the gate insulating film at a second distance toward the thickness direction of Y/3 of the gate insulating film from the interface.

2. The method as claimed in claim 1, wherein the concentration of the hydrogen or the deuterium and the concentration of the nitrogen are measured by Secondary Ion Mass Spectrometry.

3. The method as claimed in claim 1, wherein the average thickness of the gate insulating film is 10 nm or less.

4. The method as claimed in claim 3, wherein the maximum leakage current passing through the gate insulating film in the thickness direction thereof that is measured in a state that the gate voltage is applied to the electrode so that the electric field intensity in the gate insulating film is 3 MV/cm or less is $2 \times 10^{-8}$ A/cm$^2$ or less.

5. An electronic device comprising the semiconductor device manufactured by the method defined by claim 1.

6. An electronic apparatus comprising the electronic device defined by claim 5.

7. A method for manufacturing a semiconductor device comprising:
    forming a silicon oxide film including either hydrogen or deuterium on a base made of a semiconductor material;
    diffusing nitrogen into the silicon oxide film;
    forming a gate electrode on the silicon oxide film; and
    forming a source region and a drain region by doping ions to the base;
    wherein the silicon oxide film has a first region that B/A is in a range of 1.6 to 8.6, where a concentration of the nitrogen being defined as A, a concentration of the hydrogen or the deuterium being defined as B, and
    the first region being located at a first distance from a first surface of the silicon oxide film toward a second surface of the silicon oxide film, the first surface locating at an interface of the silicon oxide film and the base, and the first distance being Y/10, the Y being an average thickness of the silicon oxide film, and
    wherein the silicon oxide film has a second region where the B/A is in a range of 10.3 to 16.3, the second region is located at a second distance from the first surface toward the second surface, and the second distance is Y/3.

8. The method according to claim 7,
    the forming the silicon oxide film being performed by thermal oxidation method in atmosphere including water vapor or heavy water.

9. The method according to claim 8,
    a temperature of the thermal oxidation being in a range of 300 to 1000 degree C., a time of the thermal oxidation being in a range of 10 to 90 minutes.

10. The method according to claim 9,
    the diffusing the nitrogen into the silicon oxide film being performed by heat treatment in atmosphere including ammonia.

11. The method according to claim 10,
    a temperature of the heat treatment being in a range of 300 to 1000 degree C., a time of the heat treatment being in a range of 5 to 80 minutes.

12. The method according to claim 11,
    the temperature of the heat treatment being in a range of 450 to 750 degree C., the time of the heat treatment being in a range of 5 to 15 minutes.

* * * * *